(12) United States Patent
Netsu et al.

(10) Patent No.: US 12,119,852 B2
(45) Date of Patent: Oct. 15, 2024

(54) IMPEDANCE CONVERTING CIRCUIT AND AMPLIFIER MODULE

(71) Applicant: Murata Manufacturing Co., Ltd., Kyoto (JP)

(72) Inventors: Seiko Netsu, Kyoto (JP); Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 388 days.

(21) Appl. No.: 17/660,426

(22) Filed: Apr. 25, 2022

(65) Prior Publication Data
US 2022/0352914 A1   Nov. 3, 2022

(30) Foreign Application Priority Data

Apr. 30, 2021 (JP) ................................. 2021-077807
Dec. 22, 2021 (JP) ................................. 2021-208439

(51) Int. Cl.
*H04B 1/04* (2006.01)
*H03F 3/45* (2006.01)

(52) U.S. Cl.
CPC ....... *H04B 1/0483* (2013.01); *H03F 3/45071* (2013.01); *H04B 1/0458* (2013.01)

(58) Field of Classification Search
CPC ...... H04B 1/0483; H04B 1/0458; H04B 1/04; H04B 1/16; H04B 1/40; H03F 3/45071; H03F 2200/387; H03F 2200/451; H03F 1/56; H03F 3/195; H03F 3/45085; H03F 3/60; H03F 1/565; H03F 3/19; H03F 3/4508

See application file for complete search history.

(56) References Cited

U.S. PATENT DOCUMENTS

| | | | |
|---|---|---|---|
| 8,674,764 B2* | 3/2014 | Kondo | H03F 3/245 330/252 |
| 9,319,010 B1* | 4/2016 | Staudinger | H03F 1/565 |
| 2006/0094357 A1* | 5/2006 | McCorkle | H01P 5/10 375/280 |
| 2011/0098013 A1* | 4/2011 | Takahashi | H03F 3/189 330/144 |

(Continued)

OTHER PUBLICATIONS

Chung, Hua-Yen et al. "Design of Step-Down Broadband and Low-Loss Ruthroff-Type Baluns Using IPD Technology", IEEE Transactions on Components, Packaging and Manufacturing Technology, vol. 4, No. 6, Jun. 2014.

*Primary Examiner* — Andrew Wendell
(74) *Attorney, Agent, or Firm* — Pearne & Gordon LLP

(57) ABSTRACT

A first primary line has a first node at one end and a third node at another end and transmits a radio-frequency signal between the first node and the third node. A second primary line has a second node at one end and a fourth node at another end and transmits a radio-frequency signal between the second node and the fourth node. A first secondary line has a portion connected to the second node and is electromagnetically coupled to the first primary line. The second secondary line has a portion connected to the first node and has another end connected to a portion of the first secondary line. The second secondary line is electromagnetically coupled to the second primary line. A first capacitor is connected in parallel to a portion of the second primary line or a portion of the second secondary line.

19 Claims, 34 Drawing Sheets

(56) References Cited

U.S. PATENT DOCUMENTS

| | | | |
|---|---|---|---|
| 2012/0154043 A1* | 6/2012 | Namie | H03F 3/245 330/251 |
| 2012/0235878 A1* | 9/2012 | Mitomo | H01Q 1/50 343/860 |
| 2014/0015621 A1* | 1/2014 | Tsai | H03H 7/42 333/32 |
| 2018/0123634 A1* | 5/2018 | Settaf | H04B 1/48 |
| 2020/0177590 A1* | 6/2020 | Levy | H04W 12/10 |
| 2022/0173700 A1* | 6/2022 | Dinc | H03F 1/02 |
| 2022/0321086 A1* | 10/2022 | O'Connor | H04B 1/40 |

* cited by examiner

IMPEDANCE CONVERTING CIRCUIT AND AMPLIFIER MODULE

CROSS REFERENCE TO RELATED APPLICATION

This application claims priority from Japanese Patent Application No. 2021-077807 filed on Apr. 30, 2021 and Japanese Patent Application No. 2021-208439 filed on Dec. 22, 2021. The content of this application is incorporated herein by reference in its entirety.

BACKGROUND ART

The present disclosure relates to an impedance converting circuit and an amplifier module.

In a radio-frequency power amplifier including a differential amplifier circuit, a balanced-unbalanced converting circuit (balun) is connected to each of the input and output sides of the differential amplifier circuit. In addition, in the case where a radio-frequency power amplifier is formed by differential amplifier circuits at multiple stages, an impedance converting circuit for differential signals is inserted between stages. Hua-Yen et al. has disclosed a Guanella-type balanced-unbalanced converting circuit in "Design of Step-Down Broadband and Low-Loss Ruthroff-Type Baluns Using IPD Technology", IEEE TRANSACTIONS ON COMPONENTS, PACKAGING AND MANUFACTURING TECHNOLOGY, VOL. 4, NO. 6, JUNE 2014. FIG. 39 depicts an equivalent circuit diagram of the Guanella-type balanced-unbalanced converting circuit disclosed by Hua-Yen et al.

The Guanella-type balanced-unbalanced converting circuit includes a first node P1, a second node P2, a third node P3, and a fourth node P4. The first node P1 and the third node P3 are connected by a first primary line 101, and the second node P2 and the fourth node P4 are connected by a second primary line 102. A first secondary line 103 and a second secondary line 104 are configured to be coupled to the first primary line 101 and the second primary line 102, respectively. For example, the turns ratio (line length ratio) between the first primary line 101 and the first secondary line 103 and the turns ratio (line length ratio) between the second primary line 102 and the second secondary line 104 are both 1:1.

The first node P1 and the second node P2 are connected to one end portion of the second secondary line 104 and one end portion of the first secondary line 103, respectively, and the other end portion of the second secondary line 104 and the other end portion of the first secondary line 103 are connected to each other.

The second node P2 is grounded. The first node P1 is used for single-ended signals, and the third node P3 and the fourth node P4 are used for differential signals.

In the case where a load is connected between the third node P3 and the fourth node P4, the impedance seen at the first node P1 looking into the load side equals ¼ of the impedance of the load. Conversely, in the case where a load is connected to the first node P1, the impedance seen at the third node P3 and the fourth node P4 looking into the load side equals four times the impedance of the load. In this way, a Guanella-type balanced-unbalanced converting circuit has a function of impedance conversion.

BRIEF SUMMARY

In the Guanella-type balanced-unbalanced converting circuit, the fourth node P4 is connected to the ground with the second primary line 102 interposed therebetween. In a case where the balanced-unbalanced converting circuit depicted in FIG. 39 is formed by using an integrated passive device (IPD) based on a substrate such as a resin substrate, a low temperature co-fired ceramics (LTCC) substrate, or semiconductor substrate, it is difficult to obtain a transmission line, such as the second primary line 102, having sufficiently high inductance because the substrate is not made of magnetic material. Consequently, isolation between the fourth node P4 and the ground is insufficient, leading to an adverse effect such as a phase imbalance between differential signals. In addition, an insertion loss is large particularly at a low frequency.

If the second node P2 of the balanced-unbalanced converting circuit depicted in FIG. 39 is disconnected from the ground, a transmission-line transformer that can be used as an impedance converting circuit for differential signals is formed. In such a case, it is possible that sufficient isolation between the first node P1 and the third node P3 and between the second node P2 and the fourth node P4 cannot be obtained.

The present disclosure provides an impedance converting circuit that can easily provide isolation between an input-side node and an output-side node and an amplifier module that includes such an impedance converting circuit.

According to an aspect of the present disclosure, there is provided an impedance converting circuit including a first primary line that has a first node at one end and a third node at an opposite end and that is configured to transmit a radio-frequency signal between the first node and the third node;

a second primary line that has a second node at one end and a fourth node at an opposite end and that is configured to transmit a radio-frequency signal between the second node and the fourth node;

a first secondary line that is connected to the second node and that is configured to be electromagnetically coupled to the first primary line;

a second secondary line that has an end portion connected to the first node, that has an opposite end portion connected to an end portion of the first secondary line not connected to the second node, and that is configured to be electromagnetically coupled to the second primary line; and a first capacitor connected in parallel to at least one of at least a portion of the second primary line and at least a portion of the second secondary line.

According to another aspect of the present disclosure, there is provided an amplifier module including the impedance converting circuit described above; and a differential amplifier having a pair of differential output nodes and a pair of differential input nodes, one pair of the pair of differential output nodes and the pair of differential input nodes are respectively connected to the first node and the second node.

Parallel resonance is caused at a certain frequency by the first capacitor and an inductance component of at least one of at least a portion of the second primary line and at least a portion of the second secondary line. A high impedance state of the parallel circuit is obtained because of the parallel resonance. Consequently, sufficient isolation between the second node and the fourth node can be obtained.

DETAILED DESCRIPTION

First Embodiment

Figure 1A:
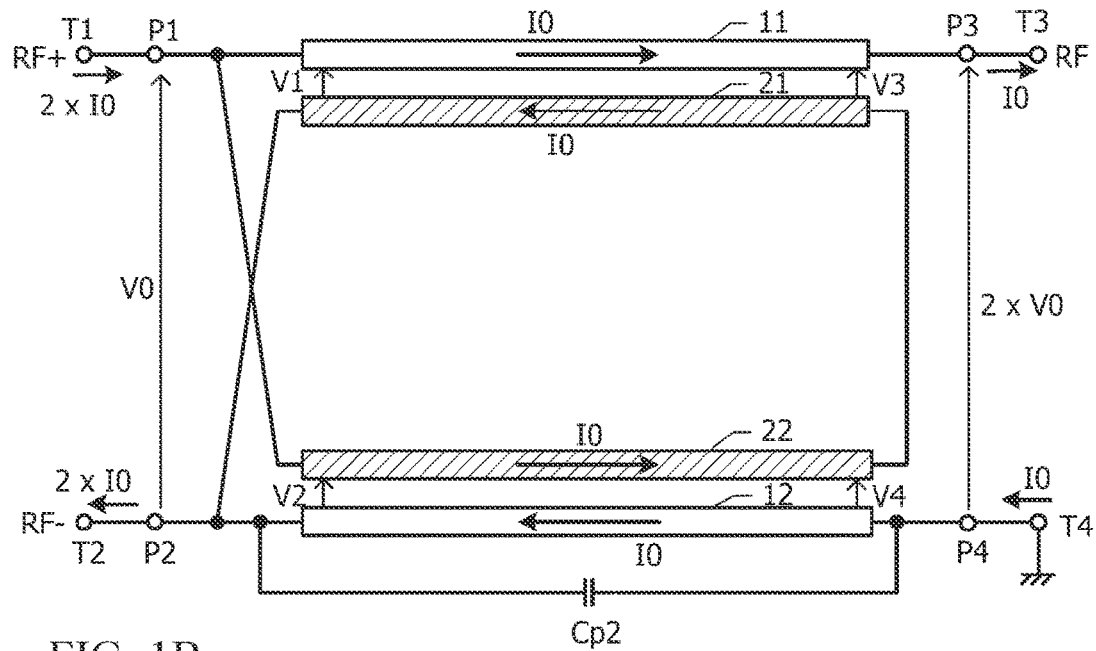
FIG. 1A is an equivalent circuit diagram of an impedance converting circuit according to a first embodiment.
Figure 1B:
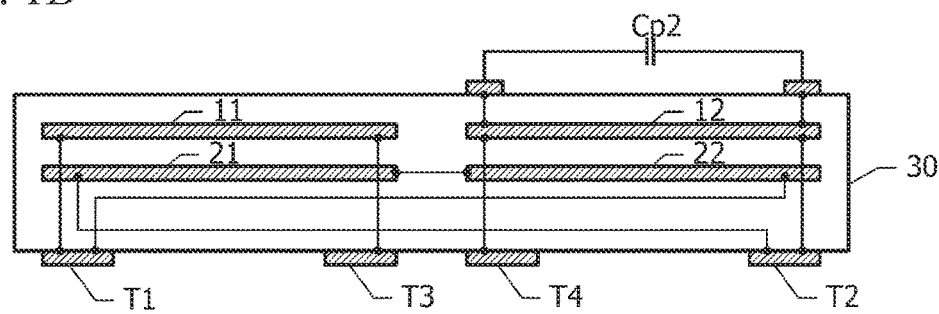
FIG. 1B is an illustration schematically depicting a cross section of the impedance converting circuit according to the first embodiment.
Figure 1C:
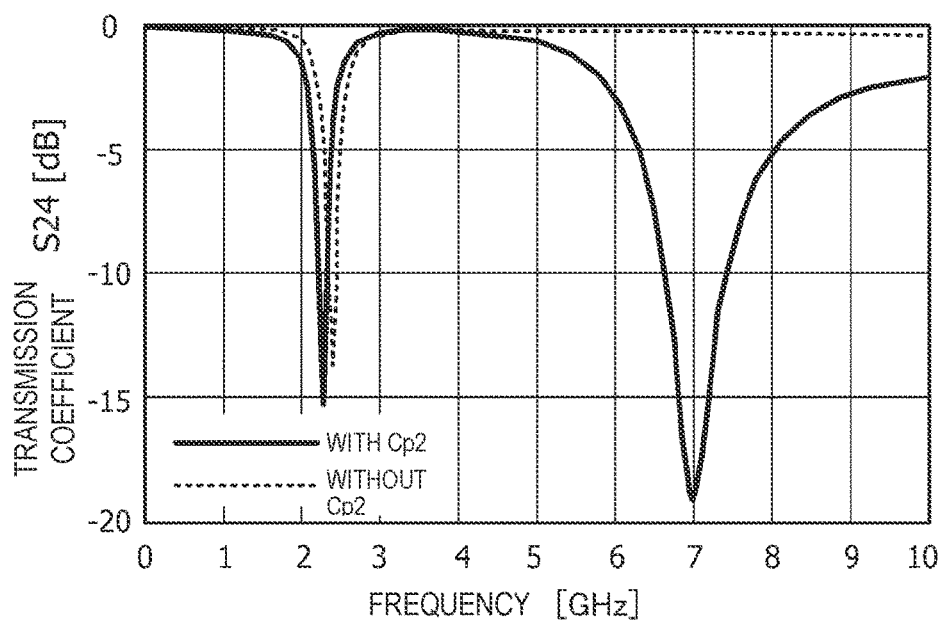
FIG. 1C is a graph depicting transmission coefficients S24 for the transmission from the fourth node P4 to the second node P2.

Referring to FIGS. 1A, 1B, and 1C, description will be given with regard to an impedance converting circuit according to a first embodiment.

FIG. 1A is an equivalent circuit diagram of the impedance converting circuit according to the first embodiment. The impedance converting circuit according to the first embodiment includes a first primary line 11 and a second primary line 12 configured to transmit a radio-frequency signal, a first secondary line 21, and a second secondary line 22 and further includes a capacitor Cp2. In FIG. 1A, the first secondary line 21 and the second secondary line 22 are hatched. The first secondary line 21 and the second secondary line 22 are configured to be electromagnetically coupled to the first primary line 11 and the second primary line 12, respectively, which are configured to transmit a radio-frequency signal. One end and the opposite end of the first primary line 11 are denoted by a first node P1 and a third node P3, respectively, and one end and the opposite end of the second primary line 12 are denoted by a second node P2 and a fourth node P4, respectively.

An end portion of the first secondary line 21 that corresponds to an end portion on the first node P1 side of the first primary line 11 is connected to the second node P2. An end portion of the second secondary line 22 that corresponds to an end portion on the second node P2 side of the second primary line 12 is connected to the first node P1. An end portion of the first secondary line 21 that corresponds to an end portion on the third node P3 side of the first primary line 11 is connected to an end portion of the second secondary line 22 that corresponds to an end portion on the fourth node P4 side of the second primary line 12.

The capacitor Cp2 is connected in parallel to the second primary line 12.

When a radio-frequency current flows through the first primary line 11, a current in the odd mode flows through the first secondary line 21. Similarly, when a radio-frequency current flows through the second primary line 12, a current in the odd mode flows through the second secondary line 22. In FIG. 1A, respective antiparallel arrows attached to two transmission lines coupled to each other indicate that currents in the odd mode flow through the two transmission lines coupled to each other.

For example, the turns ratio (line length ratio) between the first primary line 11 and the first secondary line 21 and the turns ratio (line length ratio) between the second primary line 12 and the second secondary line 22 are both 1:1. An impedance conversion ratio between the first primary line 11 and the first secondary line 21 equals an impedance conversion ratio between the second primary line 12 and the second secondary line 22. Accordingly, a voltage between both ends of the first secondary line 21 equals a voltage between both ends of the first primary line 11. Similarly, a voltage between both ends of the second secondary line 22 equals a voltage between both ends of the second primary line 12. In other words, a voltage V1 between the end portion on the first node P1 side of the first primary line 11 and the corresponding end portion of the first secondary line 21 equals a voltage V3 between the end portion on the third node P3 side of the first primary line 11 and the corresponding end portion of the first secondary line 21. Similarly, a voltage V2 between the end portion on the second node P2 side of the second primary line 12 and the corresponding end portion of the second secondary line 22 equals a voltage V4 between the end portion on the fourth node P4 side of the second primary line 12 and the corresponding end portion of the second secondary line 22.

The first node P1, the second node P2, the third node P3, and the fourth node P4 are directly connected to a first connection terminal T1, a second connection terminal T2, a third connection terminal T3, and a fourth connection terminal T4, respectively, which are used for external connection. The fourth connection terminal T4 is used as a ground terminal. The ground terminal is connected to the ground potential of a mounting board or the like.

FIG. 1B is an illustration schematically depicting a cross section of the impedance converting circuit according to the first embodiment. FIG. 1B is intended to provide a schematic illustration focusing on electrical connection and electromagnetic coupling of the transmission lines and not intended to depict a specific cross section of the impedance converting circuit. The first primary line 11, the second primary line 12, the first secondary line 21, and the second secondary line 22 may be a transmission line such as a microstripline. In FIG. 1B, the ground plane of the microstripline is not depicted.

The impedance converting circuit according to the first embodiment is formed by a laminated substrate 30 including multiple dielectric layers and multiple conductive layers that are alternately laminated. For example, a multilayer resin substrate, in which resin layers are laminated, may be used as the laminated substrate 30. Examples of a multilayer resin substrate include a printed circuit board. Alternatively, a multilayer resin substrate made of liquid crystal polymer, which has a lower permittivity, or a multilayer resin substrate made of fluoride-compound resin may be used. In addition, for example, a ceramic multilayer substrate, which has laminated ceramic layers, may be used as the laminated substrate 30. Examples of a ceramic multilayer substrate include a low temperature co-fired ceramics (LTCC) substrate and a substrate made of ceramics formed by high-temperature calcination. Further, a semiconductor substrate including multiple wiring layers may be used as the laminated substrate 30. A single conductive layer includes the first primary line 11 and the second primary line 12, and another conductive layer, which is adjacent to the conductive layer including the first primary line 11 and the second primary line 12 in the thickness direction, includes the first secondary line 21 and the second secondary line 22.

A pair of lands for mounting the capacitor Cp2 is disposed on a surface of the laminated substrate 30, which is referred to as the top surface, and the capacitor Cp2, which is surface-mounted, is connected to the pair of lands. The first connection terminal T1, the second connection terminal T2, the third connection terminal T3, and the fourth connection terminal T4 are disposed on a surface on the other side of the laminated substrate 30 from the top surface, which is referred to as the bottom surface. The first primary line 11, the second primary line 12, the first secondary line 21, the second secondary line 22, the first connection terminal T1, the second connection terminal T2, the third connection terminal T3, the fourth connection terminal T4, and the lands on the top surface are included in the laminated substrate 30 and interconnected by using via holes and conductor patterns inside the laminated substrate 30, thereby forming the impedance converting circuit depicted in FIG. 1A. In FIG. 1B, such via holes and conductor patterns are represented by solid lines having filled circles at both ends.

Next, description will be given with regard to operation of the impedance converting circuit according to the first embodiment.

When differential signals RF+ and RF− are input into a terminal pair formed by the first connection terminal T1 and the second connection terminal T2, a single-ended signal RF is output from the third connection terminal T3. The magnitude (root-mean-square value) of a voltage between the first connection terminal T1 and the second connection terminal T2 is denoted by V0. At this time, the voltages V1 and V2 equal the voltage V0 (that is, V1=V2=V0). In the first embodiment, since V1=V3 and V2=V4, the voltages V3 and V4 also equal the voltage V0 (that is, V3=V4=V0). At this time, the voltage at the third connection terminal T3 equals two times the voltage V0.

The magnitude (root-mean-square value) of a current flowing through the first primary line 11 and a current flowing through the second primary line 12 is denoted by I0. The magnitude of a current in the odd mode flowing through the first secondary line 21 and a current in the odd mode flowing through the second secondary line 22 also equals I0. Accordingly, the magnitude of a current flowing into or from the first connection terminal T1 and a current flowing into or from the second connection terminal T2 equals two times the current I0. The magnitude of a current flowing into or from the third connection terminal T3 equals I0.

In this way, the voltage of the single-ended signal RF is two times the voltage between the differential signals RF+ and RF−, and the current of the single-ended signal RF is half the current of the differential signals RF+ and RF−. Accordingly, in the case where a load is connected between the third connection terminal T3 and the fourth connection terminal T4, the impedance seen at the first connection terminal T1 and the second connection terminal T2 looking into the load side equals ¼ of the impedance of the load. Conversely, in the case where a load is connected between the first connection terminal T1 and the second connection terminal T2, the impedance seen at the third connection terminal T3 looking into the load side equals four times the impedance of the load.

The impedance converting circuit according to the first embodiment has a function of performing balanced-unbalanced conversion and impedance conversion.

Further, since the capacitor Cp2 is connected in parallel to the second primary line 12, parallel resonance is caused at a certain frequency by the second primary line 12 and the capacitor Cp2. At this resonant frequency, high impedance is obtained between the second node P2 and the fourth node P4.

Next, description will be given with regard to a positive effect according to the first embodiment in comparison with an impedance converting circuit according to a comparative example. In the impedance converting circuit according to the comparative example, the capacitor Cp2 in the impedance converting circuit according to the first embodiment is not connected.

In the impedance converting circuit according to the comparative example, the second node P2 is connected to the ground with the second primary line 12 interposed therebetween. In the case where a substrate, such as a resin substrate, a low temperature co-fired ceramics (LTCC) substrate, or a semiconductor substrate having multiple wiring layers is used as the laminated substrate 30, it is difficult to obtain the second primary line 12 having sufficiently large self-inductance in comparison with the case where a substrate made of magnetic material is used. Consequently, isolation between the second node P2 and the ground is insufficient. A decrease in isolation leads to an increase in insertion loss and a decrease in common-mode rejection ratio and leads to increases in amplitude imbalance and phase imbalance.

In the impedance converting circuit according to the first embodiment, the capacitor Cp2 is connected in parallel to the second primary line 12. Thus, parallel resonance is caused at a certain frequency by the capacitor Cp2 and the inductance component of the second primary line 12. The parallel resonance leads to high impedance between the second node P2 and the fourth node P4, which is grounded. Consequently, sufficient isolation between the second node P2 and the ground can be obtained.

In a configuration in which a pair of differential output or input nodes of a differential amplifier are respectively connected to the first node P1 and the second node P2, the characteristics of the impedance converting circuit can be improved in an operating frequency band of the differential amplifier by setting the capacitance of the capacitor Cp2 so that parallel resonance is caused in the operating frequency band of the differential amplifier. For example, the impedance converting circuit according to the first embodiment is included in a radio-frequency (RF) front-end module.

FIG. 1C is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit with the capacitor Cp2 connected according to the first embodiment, and the dashed line represents a simulation result for the impedance converting circuit without necessarily the capacitor Cp2 according to the comparative example.

The simulation conditions are as follows.

The first primary line 11, the second primary line 12, the first secondary line 21, and the second secondary line 22 are each assumed to be 2000 μm long, 25 μm wide, and 3 μm thick. The line spacing between the first primary line 11 and the first secondary line 21 and the line spacing between the second primary line 12 and the second secondary line 22 are both assumed to be 3 μm. The capacitance of the capacitor Cp2 is assumed to be 0.7 pF. The relative permittivity of the laminated substrate 30 is assumed to be 4.

In the comparative example, isolation between the second node P2 and the fourth node P4 is obtained only in the vicinity of a frequency of 2.5 GHz. In contrast, in the case where the capacitor Cp2 is connected, isolation is also obtained in the vicinity of a frequency of 7 GHz. Accordingly, sufficient isolation between the second node P2 and the fourth node P4 can also be obtained when the impedance converting circuit is operated in the vicinity of a frequency of 7 GHz.

Next, referring to FIGS. 2A and 2B, description will be given with regard to an impedance converting circuit according to a first modification to the first embodiment.

Figure 2A:
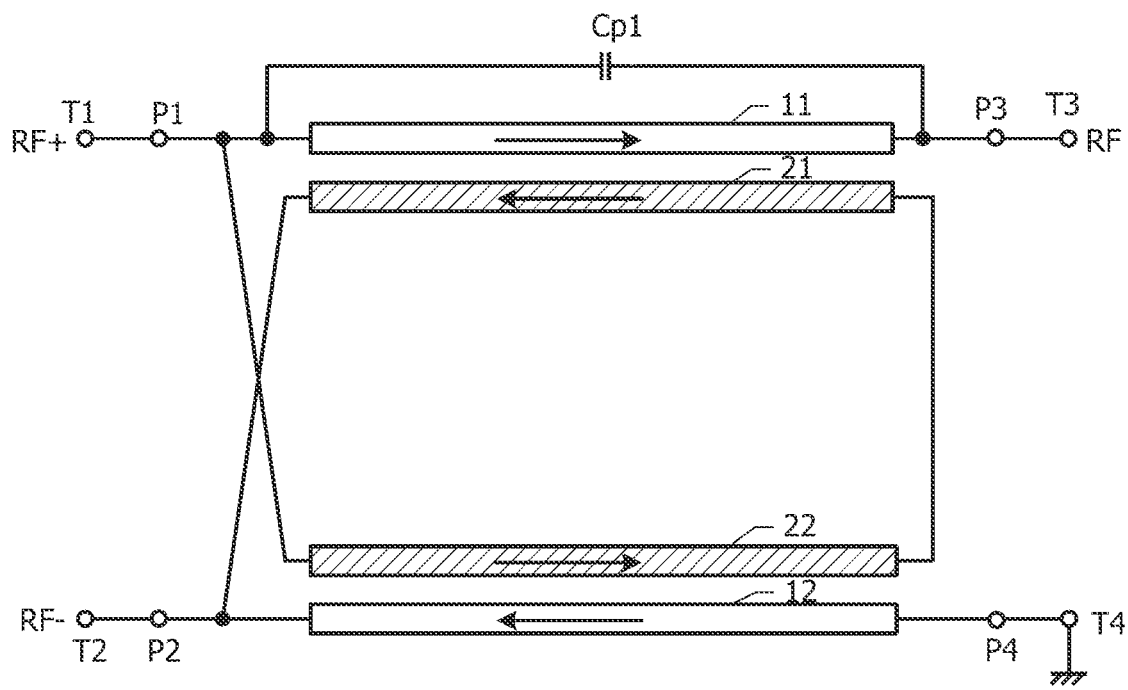
FIG. 2A is an equivalent circuit diagram of an impedance converting circuit according to a first modification to the first embodiment.

FIG. 2A is an equivalent circuit diagram of the impedance converting circuit according to the first modification to the first embodiment. While the capacitor Cp2 is connected in parallel to the second primary line 12 in the first embodiment (FIG. 1A), the capacitor Cp2 is not connected to the second primary line 12 in the first modification to the first embodiment, and a capacitor Cp1 is connected in parallel to the first primary line 11 instead.

Figure 2B:
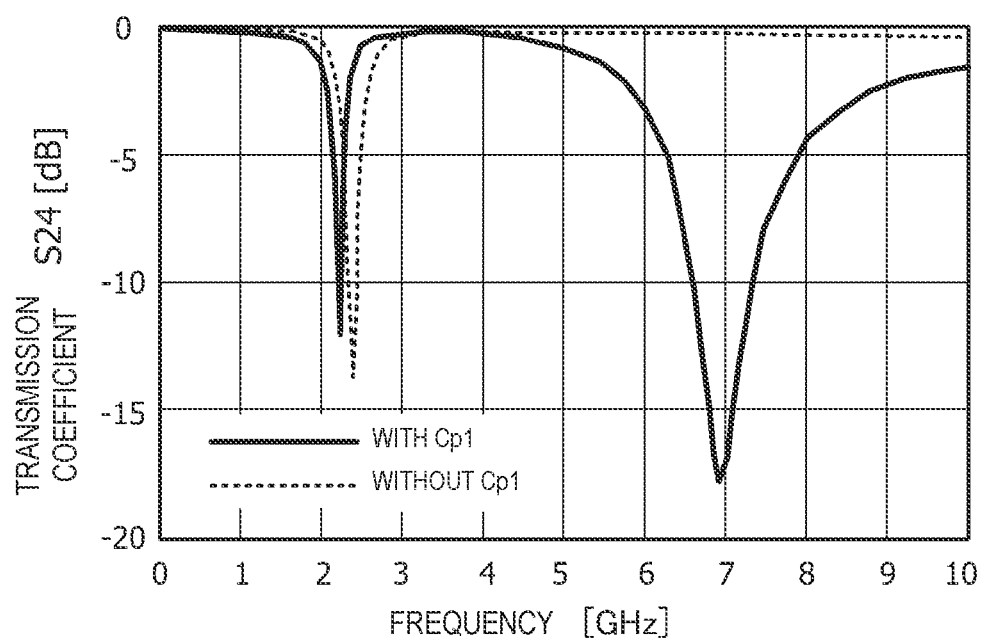
FIG. 2B is a graph depicting transmission coefficients S24 for the transmission from the fourth node P4 to the second node P2.

FIG. 2B is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit according to the first modification to the first embodiment (FIG. 2A), and the dashed line represents a simulation result for an impedance converting circuit without necessarily the capacitor Cp1 according to the comparative example.

Simulation conditions other than the capacitance of the capacitor Cp1 are the same as the simulation conditions in FIG. 1C. The capacitance of the capacitor Cp1 is assumed to be 0.7 pF. Sufficient isolation is also obtained in the vicinity of a frequency of 7 GHz in the present modification as in the first embodiment (FIG. 1C).

Next, referring to FIGS. 3A and 3B, description will be given with regard to an impedance converting circuit according to a second modification to the first embodiment.

Figure 3A:
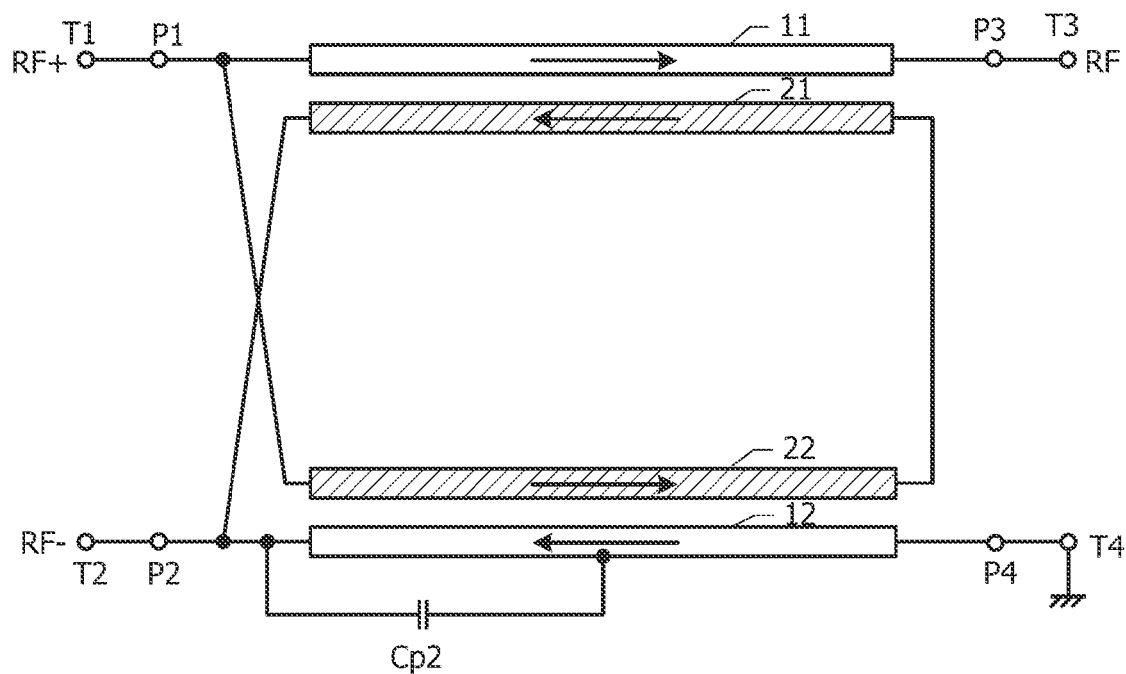
FIG. 3A is an equivalent circuit diagram of an impedance converting circuit according to a second modification to the first embodiment.

FIG. 3A is an equivalent circuit diagram of the impedance converting circuit according to the second modification to the first embodiment. While the capacitor Cp2 is connected between both ends of the second primary line 12 in the first embodiment (FIG. 1A), the capacitor Cp2 is connected between the end portion on the second node P2 side of the second primary line 12 and the middle point of the second primary line 12 in the second modification to the first embodiment.

Figure 3B:
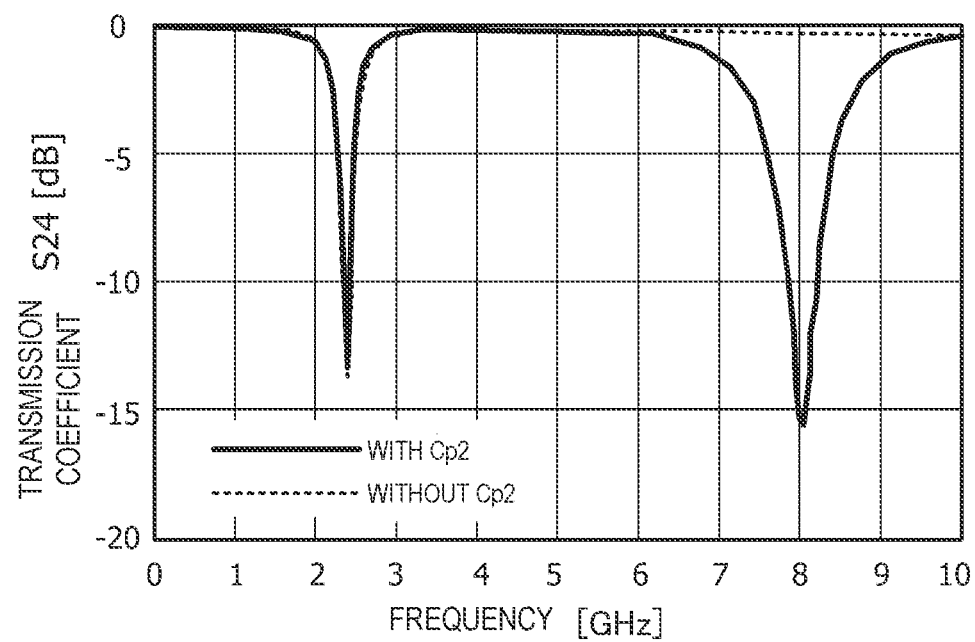
FIG. 3B is a graph depicting transmission coefficients S24 for the transmission from the fourth node P4 to the second node P2.

FIG. 3B is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit according to the second modification to the first embodiment (FIG. 3A), and the dashed line represents a simulation result for an impedance converting circuit without necessarily the capacitor Cp2 according to a comparative example.

Simulation conditions are the same as the simulation conditions in FIG. 1C. A portion of the second primary line 12 that is connected in parallel to the capacitor Cp2 is 1000 μm long. Sufficient isolation is obtained in the vicinity of a frequency of 8 GHz in the second modification to the first embodiment because the resonant frequency of the parallel resonance caused by the second primary line 12 and the capacitor Cp2 changes from the resonant frequency of the parallel resonance in the first embodiment (FIG. 1A). A frequency range in which sufficient isolation is obtained can be changed by changing the length of a portion of the second primary line 12 that is connected in parallel to the capacitor Cp2.

Second Embodiment

Next, referring to the drawings from FIG. 4A to FIG. 7, description will be given with regard to an impedance converting circuit according to a second embodiment. Description will be omitted herein with regard to the configuration that is the same as the configuration of the impedance converting circuit according to the first embodiment (FIGS. 1A and 1B).

Figure 4A:
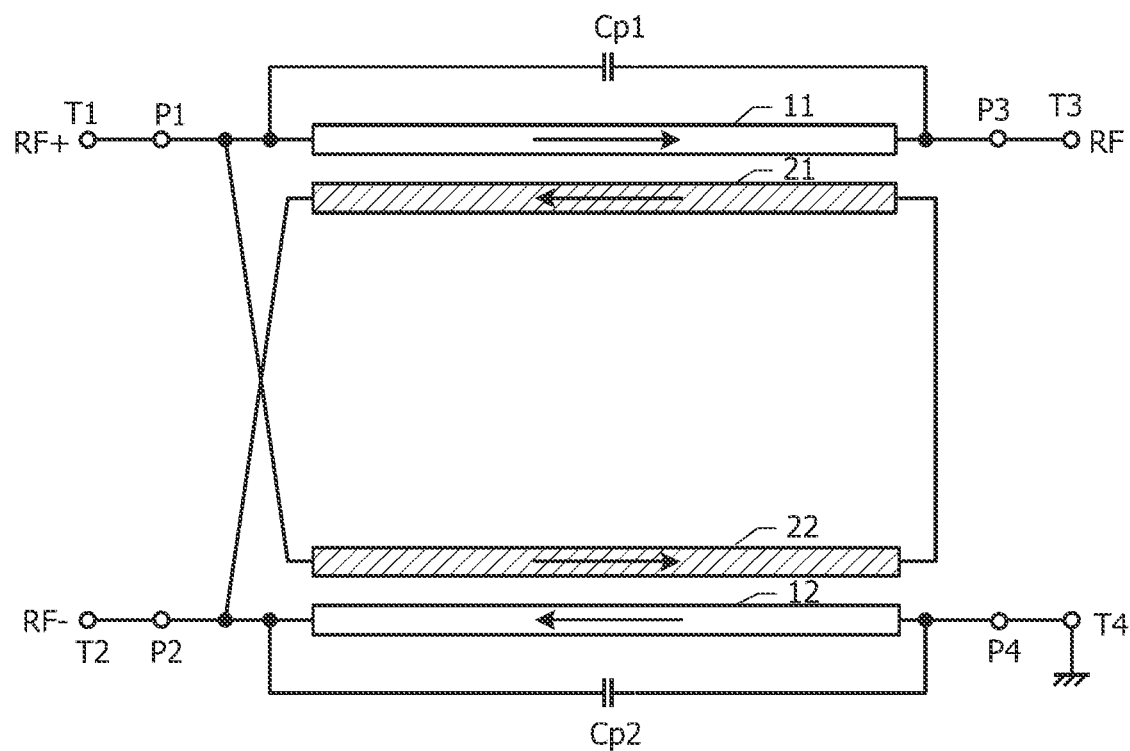
FIG. 4A is an equivalent circuit diagram of an impedance converting circuit according to a second embodiment.
Figure 4B:
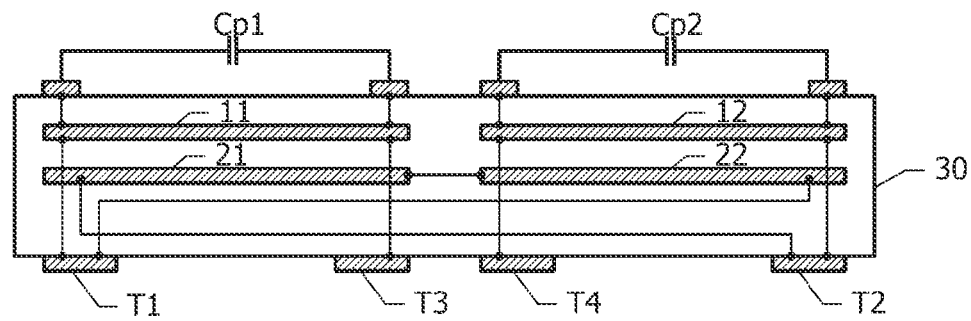
FIG. 4B is an illustration schematically depicting a cross section of the impedance converting circuit according to the second embodiment.

FIG. 4A is an equivalent circuit diagram of the impedance converting circuit according to the second embodiment, and FIG. 4B is an illustration schematically depicting a cross section of the impedance converting circuit according to the second embodiment. In the second embodiment, a capacitor Cp1 connected in parallel to the first primary line 11 is included in addition to the capacitor Cp2 connected in parallel to the second primary line 12. Similarly to the capacitor Cp2, the capacitor Cp1 (FIG. 4B) is mounted on the top surface of the laminated substrate 30.

Simulation has been performed to verify a positive effect according to the second embodiment. The simulation will be described below.

Insertion losses, common-mode rejection ratios (CMRRs), amplitude imbalances, and phase imbalances have been obtained by simulation for the impedance converting circuit according to the second embodiment and for an impedance converting circuit according to a comparative example. The impedance converting circuit according to the comparative example has the same configuration as the impedance converting circuit according to the second embodiment except that the capacitors Cp1 and Cp2 are not included. Simulation conditions are the same as the simulation conditions for the first embodiment, which have been described with reference to FIG. 1C. The capacitances of the capacitors Cp1 and Cp2 are both assumed to be 0.7 pF.

Figure 5A:
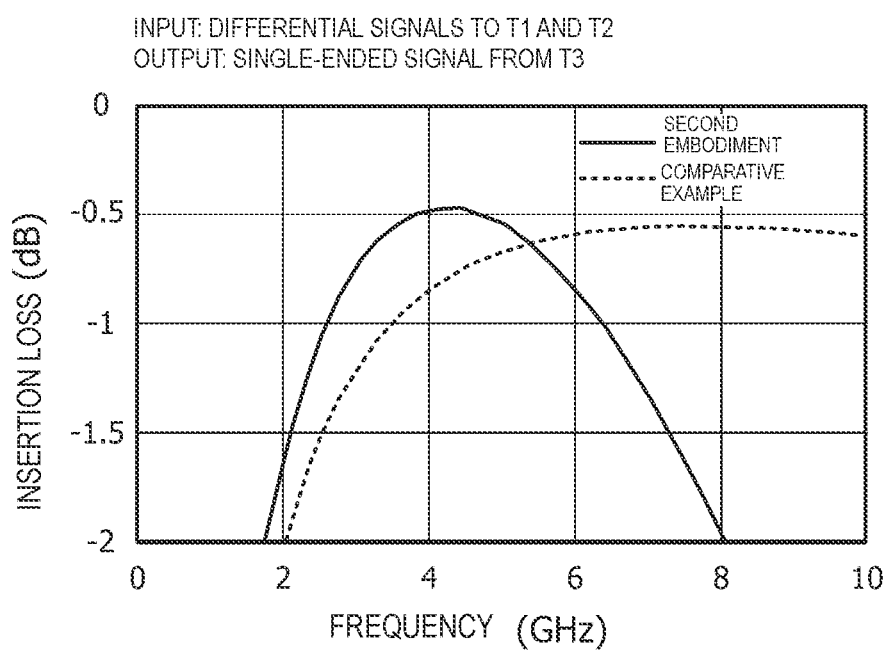
FIG. 5A is a graph depicting insertion losses of the impedance converting circuits according to the second embodiment and a comparative example.

FIG. 5A is a graph depicting insertion losses of the impedance converting circuits. The horizontal axis represents a frequency in the unit "GHz", and the vertical axis represents the insertion loss in the unit "dB". A point located lower in the vertical axis represents a larger insertion loss. The insertion loss herein indicates an insertion loss obtained when the first connection terminal T1 and the second connection terminal T2 are driven with differential signals and a single-ended signal is output from the third connection terminal T3. The solid line and the dashed line in the graph in FIG. 5A represent the insertion losses of the impedance converting circuits according to the second embodiment and the comparative example, respectively. It can be seen that the insertion loss of the impedance converting circuit according to the second embodiment is improved at frequencies approximately equal to 5.3 GHz or lower.

Figure 5B:
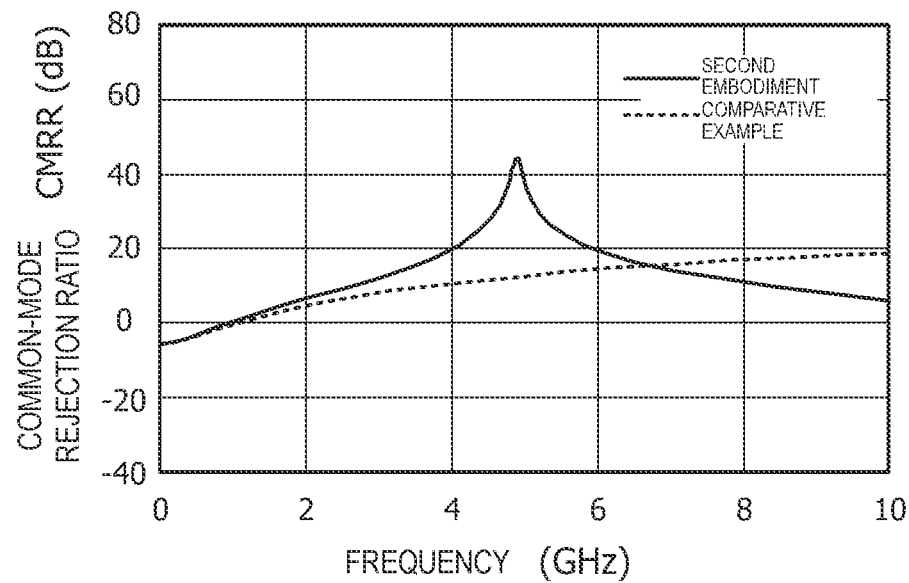
FIG. 5B is a graph depicting common-mode rejection ratios of the impedance converting circuits.

FIG. 5B is a graph depicting common-mode rejection ratios CMRRs of the impedance converting circuits. The horizontal axis represents a frequency in the unit "GHz", and the vertical axis represents the common-mode rejection ratio in the unit "dB". The solid line and the dashed line in the graph in FIG. 5B represent the common-mode rejection ratios according to the second embodiment and the comparative example, respectively. The definition of the common-mode rejection ratio will be described below.

The common-mode rejection ratio CMRR is defined as CMRR=SSD12/SSC12, where SSD12 is a single-ended signal response that is output from the third connection terminal T3 when the first connection terminal T1 and the second connection terminal T2 are driven with differential signals and SSC12 is a single-ended signal response that is output from the third connection terminal T3 when the first connection terminal T1 and the second connection terminal T2 are driven with common-mode signals. In the case where the impedance converting circuit is an ideal balun, when the first connection terminal T1 and the second connection terminal T2 are driven with common-mode signals, the single-ended signal response SSC 12 that is output from the third connection terminal T3 is nearly zero. Thus, a larger value of the common-mode rejection ratio CMRR indicates better characteristics as a balun.

As depicted in FIG. 5B, the common-mode rejection ratio is larger in the frequency range approximately from 2 GHz to 6.5 GHz for the impedance converting circuit according to the second embodiment than for the impedance converting circuit according to the comparative example. In other words, the characteristics as a balun is improved.

Figure 6A:
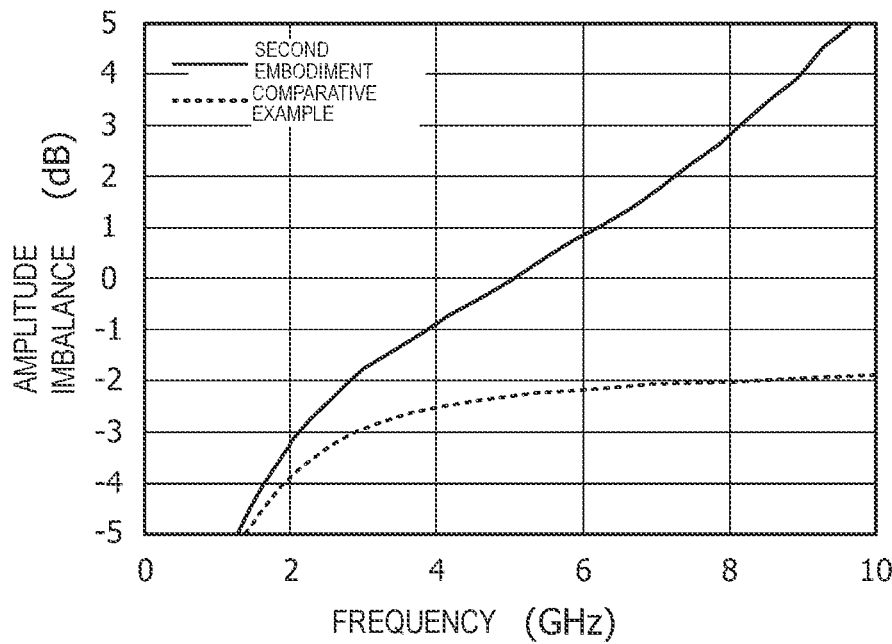
FIG. 6A is a graph depicting amplitude imbalances of the impedance converting circuits according to the second embodiment and the comparative example.
Figure 6B:
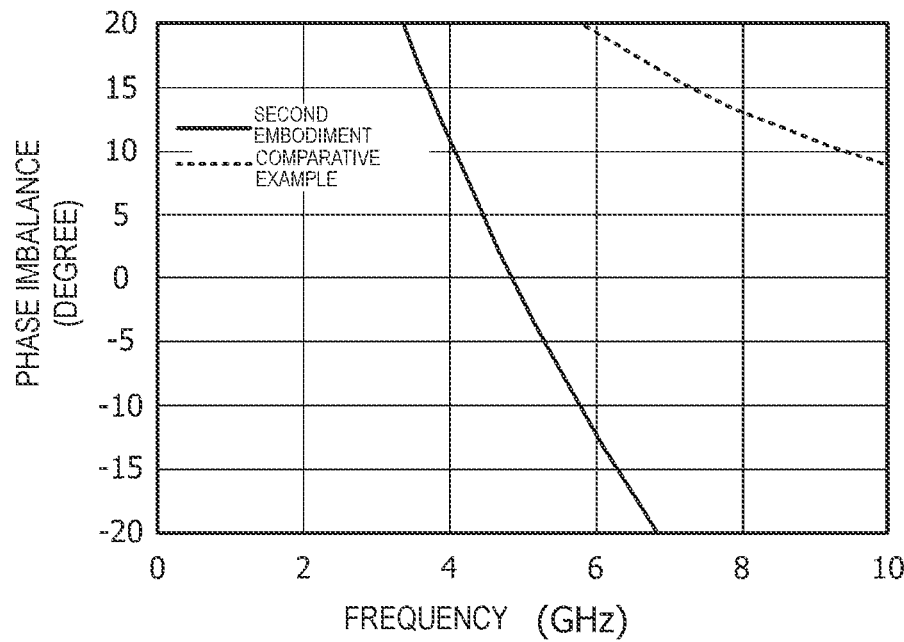
FIG. 6B is a graph depicting phase imbalances of the impedance converting circuits.

FIGS. 6A and 6B present graphs depicting amplitude imbalances and phase imbalances, respectively, of the impedance converting circuits. The horizontal axes of FIGS. 6A and 6B represent a frequency in the unit "GHz", the vertical axis of FIG. 6A represents the amplitude imbalance in the unit "dB", and the vertical axis of FIG. 6B represents the phase imbalance in the unit "degree". The solid lines and the dashed lines represent simulation results for the impedance converting circuits according to the second embodiment and the comparative example, respectively, in the graphs in FIGS. 6A and 6B. The definitions of the amplitude imbalance and the phase imbalance will be described below.

A single-ended signal response that is output from the third connection terminal T3 when the first connection terminal T1 is driven with a single-ended signal is denoted by S13, and a single-ended signal response that is output from the third connection terminal T3 when the second connection terminal T2 is driven with a single-ended signal is denoted by S23. The imbalance IMB is defined as IMB=−S13/S23. The amplitude imbalance and the phase imbalance are the amplitude component and the phase component, respectively, of the imbalance IMB. The amplitude imbalance closer to 0 dB and the phase imbalance closer to 0 degree indicate better characteristics of a balanced-unbalanced converting circuit.

As depicted in FIGS. 6A and 6B, the amplitude imbalance and the phase imbalance are improved at frequencies approximately equal to 6 GHz or lower by adopting the configuration of the impedance converting circuit according to the second embodiment.

Figure 7:
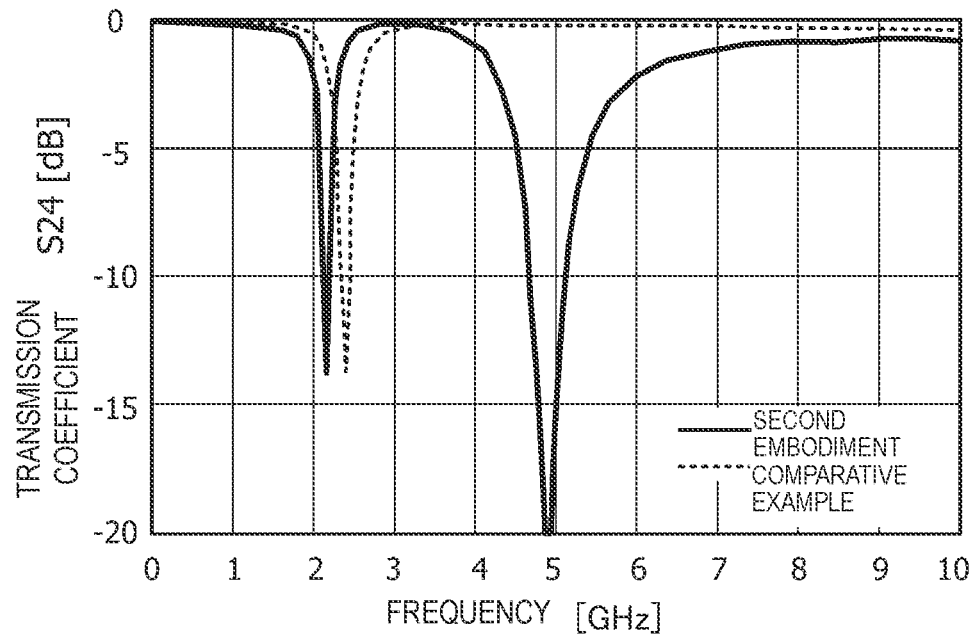
FIG. 7 is a graph depicting transmission coefficients S24 for the transmission from the fourth node P4 to the second node P2 of the impedance converting circuits according to the second embodiment and the comparative example.

FIG. 7 is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit according to the second embodiment, and the dashed line represents a simulation result for the impedance converting circuit according to the comparative example.

Sufficient isolation is obtained in the vicinity of a frequency of 7 GHz in the first embodiment (FIG. 1C), and sufficient isolation is obtained in the vicinity of a frequency of 5 GHz in the second embodiment. A frequency range in which sufficient isolation is obtained can be varied by adjusting the capacitances of the capacitors Cp1 and Cp2. Sufficient isolation between the second node P2 and the fourth node P4 can also be obtained in a specific frequency range in the second embodiment.

It is confirmed from the simulation results depicted in the drawings from FIG. 5A to FIG. 7 that the characteristics of the impedance converting circuit are improved by connecting the capacitors Cp1 and Cp2 in parallel to the first primary line 11 and the second primary line 12, respectively.

In addition, the symmetry between the first primary line 11 and the second primary line 12 can be maintained because not only the capacitor Cp2 is connected in parallel to the second primary line 12 but also the capacitor Cp1 is connected in parallel to the first primary line 11. It is desirable to make the inductances of the first primary line 11 and the second primary line 12 equal and make the capacitances of the capacitors Cp1 and Cp2 equal to maintain the symmetry.

Third Embodiment

Next, referring to the drawings from FIG. 8 to FIG. 10B, description will be given with regard to an impedance converting circuit according to a third embodiment. Description will be omitted herein with regard to the configuration that is the same as the configuration of the impedance converting circuit according to the second embodiment, which has been described with reference to the drawings from FIG. 4A to FIG. 7.

Figure 8:
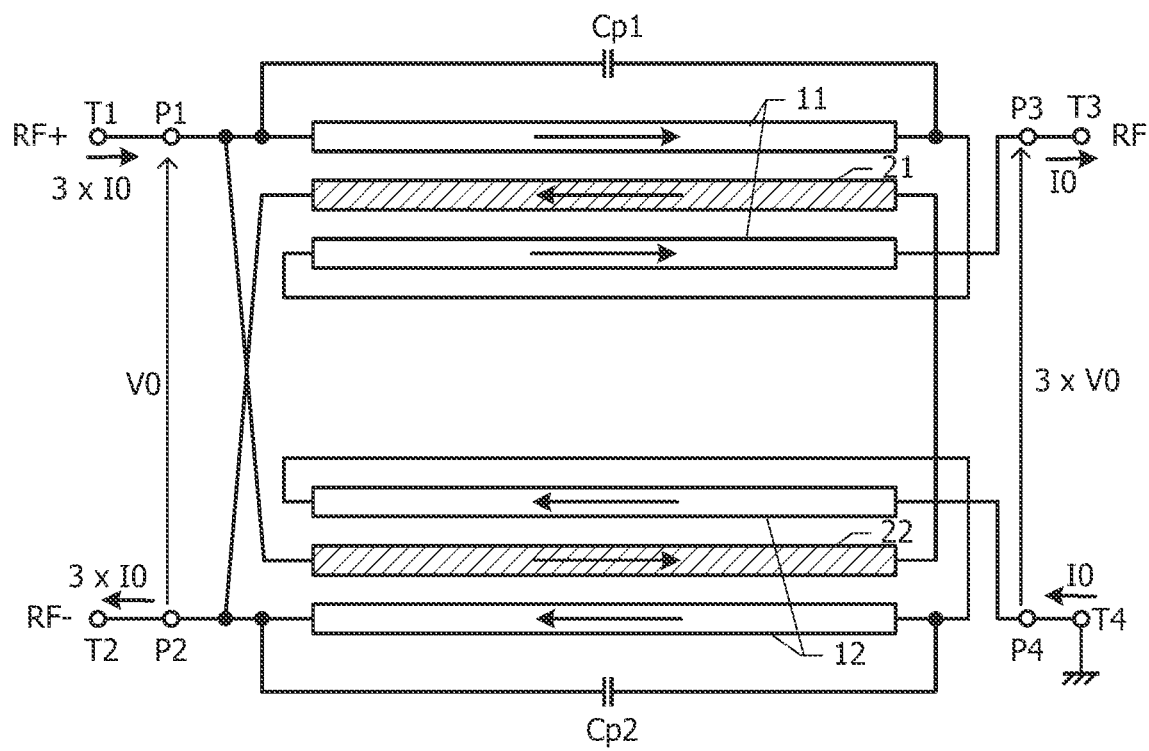
FIG. 8 is an equivalent circuit diagram of an impedance converting circuit according to a third embodiment.

FIG. 8 is an equivalent circuit diagram of the impedance converting circuit according to the third embodiment. In the second embodiment (FIG. 4A), the turns ratio (line length ratio) between the first primary line 11 and the first secondary line 21 and the turns ratio (line length ratio) between the second primary line 12 and the second secondary line 22 are both 1:1. In contrast, in the third embodiment, the turns ratio (line length ratio) between the first primary line 11 and the first secondary line 21 and the turns ratio (line length ratio) between the second primary line 12 and the second secondary line 22 are both 2:1.

Further, in the second embodiment (FIG. 4A), the capacitors Cp1 and Cp2 are connected to both ends of the first primary line 11 and the second primary line 12, respectively. In contrast, in the third embodiment, the capacitor Cp1 is connected in parallel to a part of the first primary line 11, and the other capacitor Cp2 is connected in parallel to a part of the second primary line 12. For example, the capacitor Cp2 is connected between the second node P2 and the middle point of the second primary line 12. In other words, the capacitor Cp2 is connected in parallel to the inductance component of the part of the second primary line 12. Similarly, the capacitor Cp1 is also connected between the first node P1 and the middle point of the first primary line 11.

Next, description will be given with regard to operation of the impedance converting circuit according to the third embodiment.

In the impedance converting circuit according to the third embodiment, the voltage between the third connection terminal T3 and the fourth connection terminal T4 is three times the voltage between the first connection terminal T1 and the second connection terminal T2. The current flowing into or from the third connection terminal T3 is ⅓ of the current flowing into or from the first connection terminal T1 and the current flowing into or from the second connection terminal T2.

In this way, the voltage of the single-ended signal RF that appears at the third connection terminal T3 is three times the voltage between the differential signals RF+ and RF−, which appear at the first connection terminal T1 and the second connection terminal T2, and the current of the single-ended signal RF is ⅓ of the current of the differential signals RF+ and RF−. Accordingly, in the case where a load is connected between the third connection terminal T3 and the fourth connection terminal T4, the impedance seen at the first connection terminal T1 and the second connection terminal T2 looking into the load side equals ⅑ of the impedance of the load. Conversely, in the case where a load is connected between the first connection terminal T1 and the second connection terminal T2, the impedance seen at the third connection terminal T3 looking into the load side equals nine times the impedance of the load. In this way, an impedance conversion ratio of 9 is obtained by the impedance converting circuit according to the third embodiment.

In addition, in the third embodiment, parallel resonance is caused by the part of the second primary line 12 and the capacitor Cp2. The parallel resonance caused by the part of the second primary line 12 and the capacitor Cp2 leads to high impedance between the second node P2 and the fourth node P4 (ground). Consequently, similarly to the second embodiment, sufficient isolation between the second node P2 and the ground can be obtained. In addition, the symmetry between the first primary line 11 and the second primary line 12 can be maintained because the capacitor Cp1 is connected in parallel to the part of the first primary line 11.

Next, referring to the drawings from FIG. 9A to FIG. 10B, description will be given with regard to results of simulation performed to verify a positive effect according to the third embodiment. The first primary line 11 and the second primary line 12 of an impedance converting circuit used for simulation are assumed to be 3200 µm long and 30 µm wide. The first secondary line 21 and the second secondary line 22 are assumed to be 1600 µm long and 34 µm wide. The capacitances of the capacitors Cp1 and Cp2 are assumed to be 0.3 pF. Other simulation conditions are the same as the simulation conditions in FIG. 1C in the first embodiment.

Similarly to FIGS. 5A, 5B, 6A, and 6B in the second embodiment, FIGS. 9A, 9B, 10A, and 10B present graphs depicting insertion losses, common-mode rejection ratios, amplitude imbalances, and phase imbalances, respectively, of the impedance converting circuits. The solid lines and the dashed lines in these graphs represent simulation results for the impedance converting circuits according to the third embodiment and a comparative example, respectively, and the comparative example includes neither the capacitor Cp1 nor the capacitor Cp2.

Figure 9A:
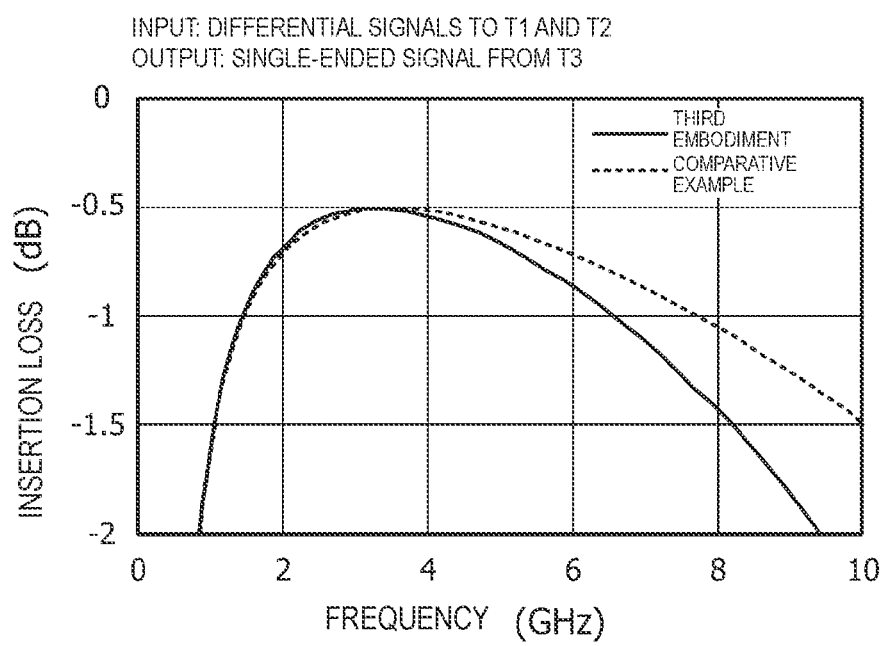
FIG. 9A is a graph depicting insertion losses of the impedance converting circuits according to the third embodiment and a comparative example.
Figure 9B:
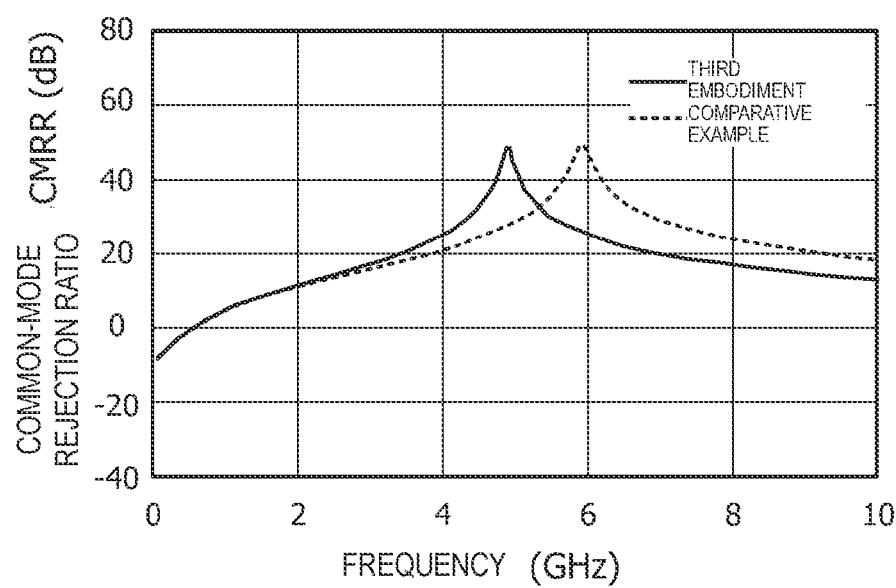
FIG. 9B is a graph depicting common-mode rejection ratios of the impedance converting circuits.
Figure 10A:
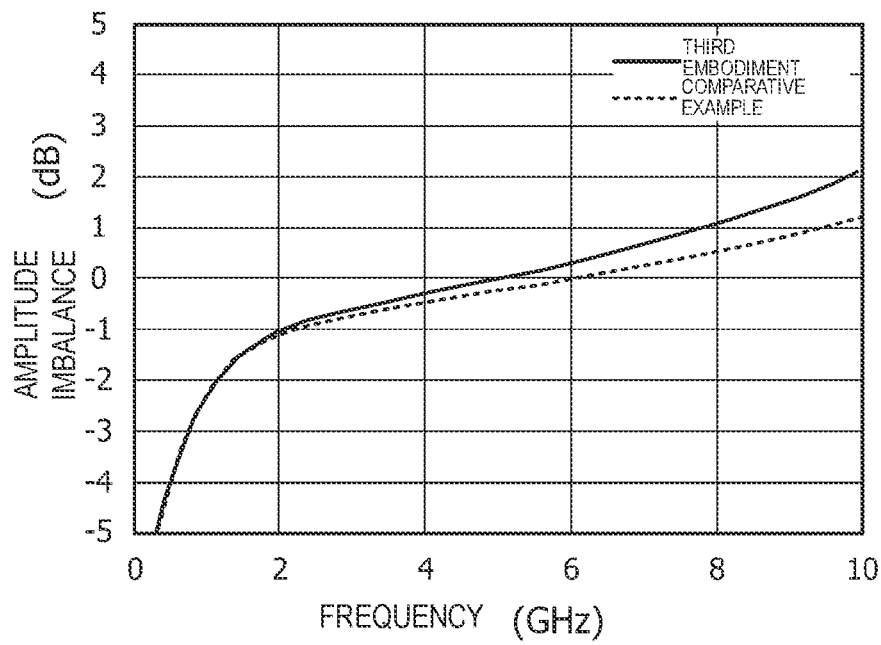
FIG. 10A is a graph depicting amplitude imbalances of the impedance converting circuits according to the third embodiment and the comparative example.
Figure 10B:
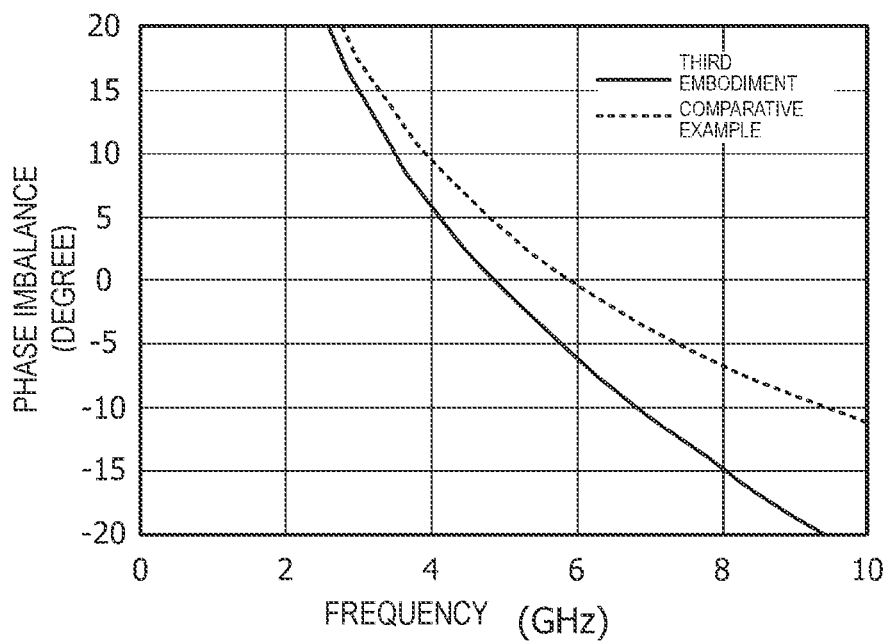
FIG. 10B is a graph depicting phase imbalances of the impedance converting circuits.

As depicted in FIG. 9A, in terms of insertion loss, the impedance converting circuit according to the third embodiment produces no improvement over the impedance converting circuit according to the comparative example. As depicted in FIG. 9B, the impedance converting circuit according to the third embodiment produces an improvement in the common-mode rejection ratio in the frequency range approximately from 3 GHz to 5.3 GHz. As depicted in FIG. 10A, the impedance converting circuit according to the third embodiment produces an improvement in the amplitude imbalance in the frequency range approximately from 2 GHz to 5 GHz. As depicted in FIG. 10B, the impedance converting circuit according to the third embodiment produces an improvement in the phase imbalance in the frequency range approximately from 3 GHz to 5 GHz.

It is confirmed from the simulation results depicted in the drawings from FIG. 9A to FIG. 10B that the characteristics of the impedance converting circuit are improved by connecting the capacitors Cp1 and Cp2 in parallel to a part of the first primary line 11 and a part of the second primary line 12, respectively.

Next, a modification to the third embodiment will be described.

In the third embodiment, the turns ratio (line length ratio) between the first primary line 11 and the first secondary line 21 and the turns ratio (line length ratio) between the second primary line 12 and the second secondary line 22 are both 2:1. The turns ratio may differ from 2:1. In this way, the impedance conversion ratio can be adjusted.

Fourth Embodiment

Next, referring to the drawings from FIG. 11 to FIG. 13B, description will be given with regard to an impedance converting circuit according to a fourth embodiment. Description will be omitted herein with regard to the configuration that is the same as the configuration of the impedance converting circuit according to the third embodiment, which has been described with reference to the drawings from FIG. 8 to FIG. 10B.

Figure 11:
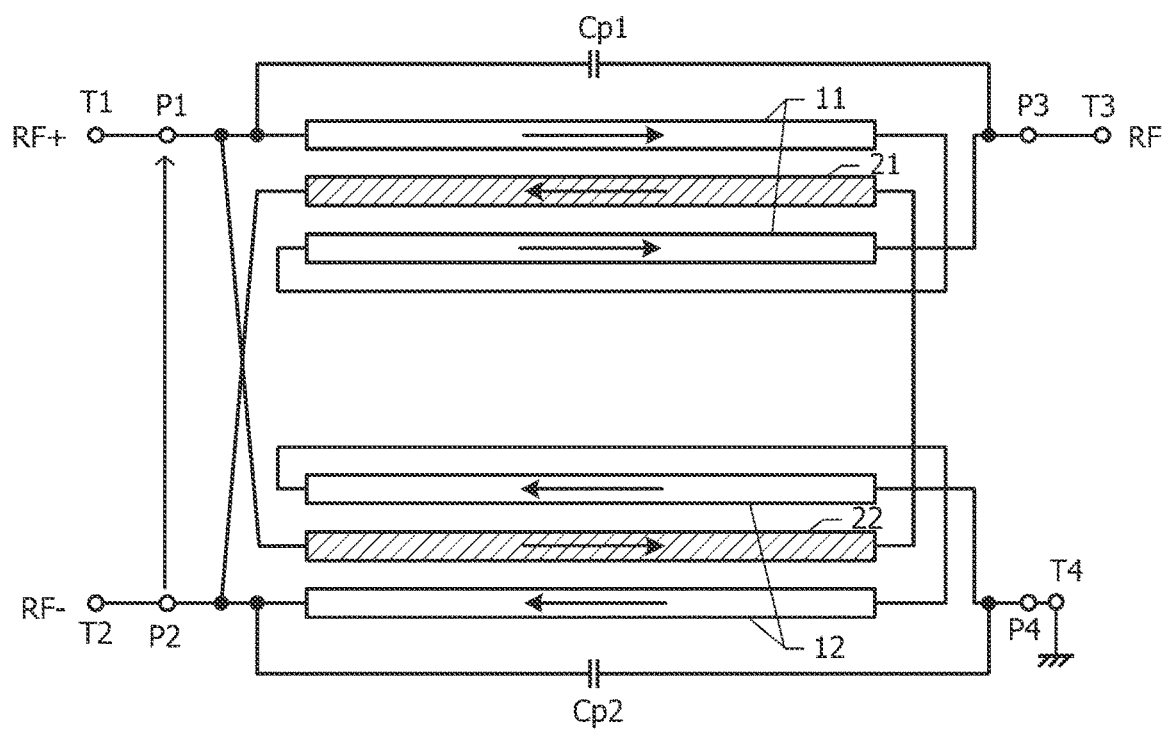
FIG. 11 is an equivalent circuit diagram of an impedance converting circuit according to a fourth embodiment.

FIG. 11 is an equivalent circuit diagram of the impedance converting circuit according to the fourth embodiment. In the impedance converting circuit according to the third embodiment (FIG. 8), the capacitor Cp2 is connected in parallel to a part of the second primary line 12, and the capacitor Cp1 is connected in parallel to a part of the first primary line 11. In contrast, in the fourth embodiment, the capacitor Cp2 is connected to both ends of the second primary line 12, and the capacitor Cp1 is connected to both ends of the first primary line 11.

The impedance conversion ratio of the impedance converting circuit according to the fourth embodiment is the same as the impedance conversion ratio of the impedance converting circuit according to the third embodiment.

Next, description will be given with regard to a positive effect according to the fourth embodiment.

In the fourth embodiment, sufficient isolation can be obtained between the second node P2 and the fourth node P4 (ground) because of parallel resonance caused by the whole of the second primary line 12 and the capacitor Cp2. In addition, the symmetry between the first primary line 11 and the second primary line 12 can be maintained because the capacitor Cp1 is connected in parallel to the first primary line 11.

Next, referring to the drawings from FIG. 12A to FIG. 13B, description will be given with regard to results of simulation performed to verify a positive effect according to the fourth embodiment. The first primary line 11 and the second primary line 12 of an impedance converting circuit used for simulation are assumed to be 3200 µm long and 30 µm wide. The first secondary line 21 and the second secondary line 22 are assumed to be 1600 µm long and 34 µm wide. The capacitances of the capacitors Cp1 and Cp2 are assumed to be 0.3 pF. Other simulation conditions are the same as the simulation conditions in FIG. 1C in the first embodiment.

Similarly to FIGS. 8A, 8B, 9A, and 9B in the third embodiment, FIGS. 12A, 12B, 13A, and 13B present graphs depicting insertion losses, common-mode rejection ratios, amplitude imbalances, and phase imbalances, respectively, of the impedance converting circuits. The solid lines and the dashed lines in these graphs represent simulation results for the impedance converting circuits according to the fourth embodiment and a comparative example, respectively, and the comparative example includes neither the capacitor Cp1 nor the capacitor Cp2.

Figure 12A:
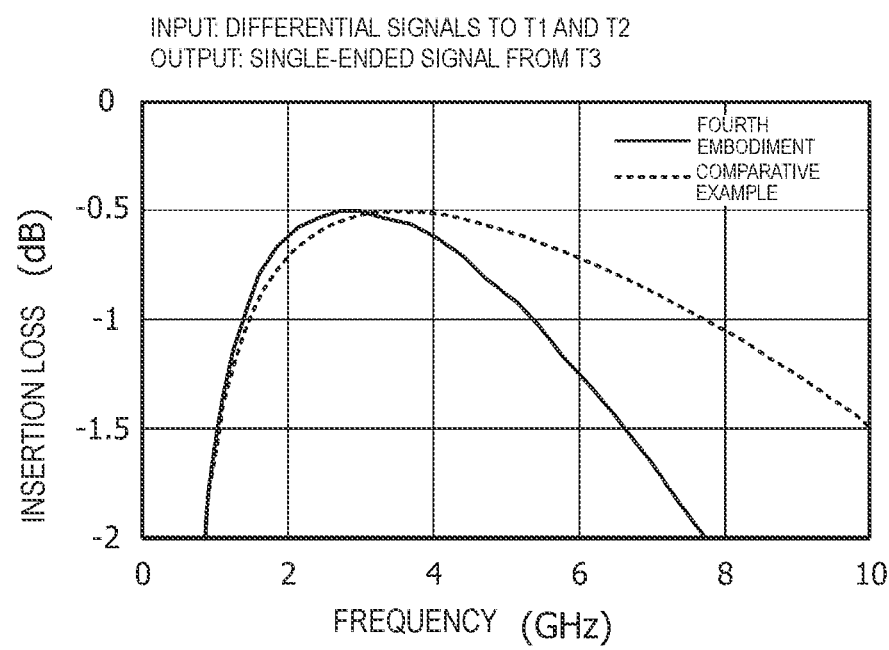
FIG. 12A is a graph depicting insertion losses of the impedance converting circuits according to the fourth embodiment and a comparative example.
Figure 12B:
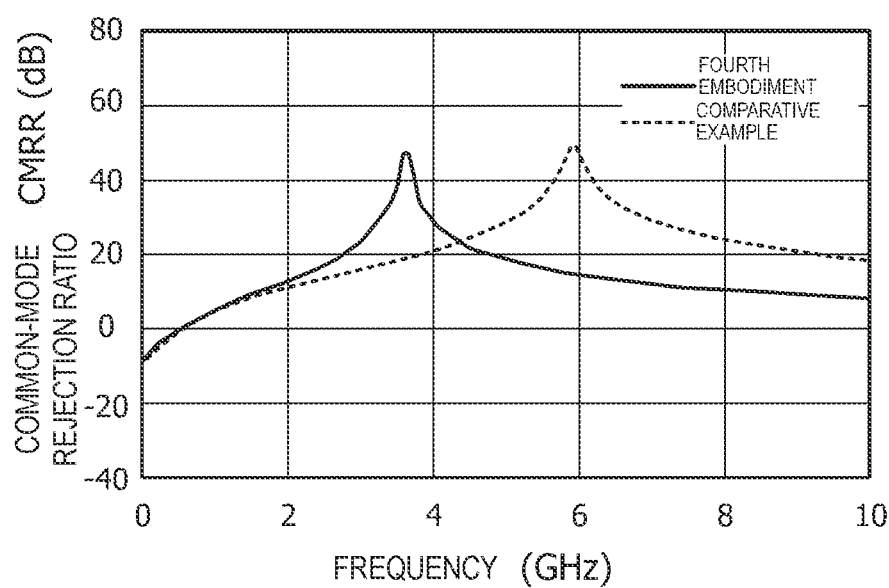
FIG. 12B is a graph depicting common-mode rejection ratios of the impedance converting circuits.
Figure 13A:
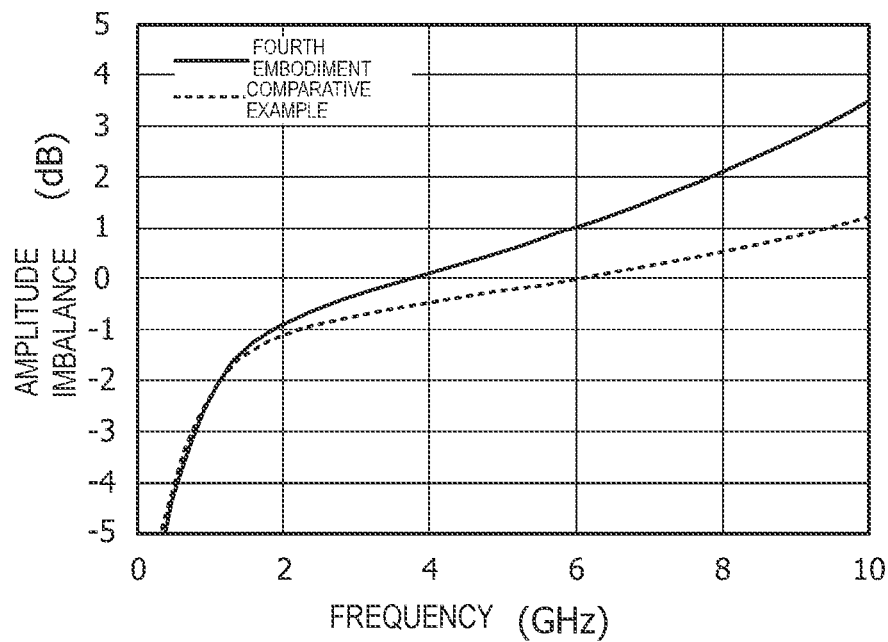
FIG. 13A is a graph depicting amplitude imbalances of the impedance converting circuits according to the fourth embodiment and the comparative example.
Figure 13B:
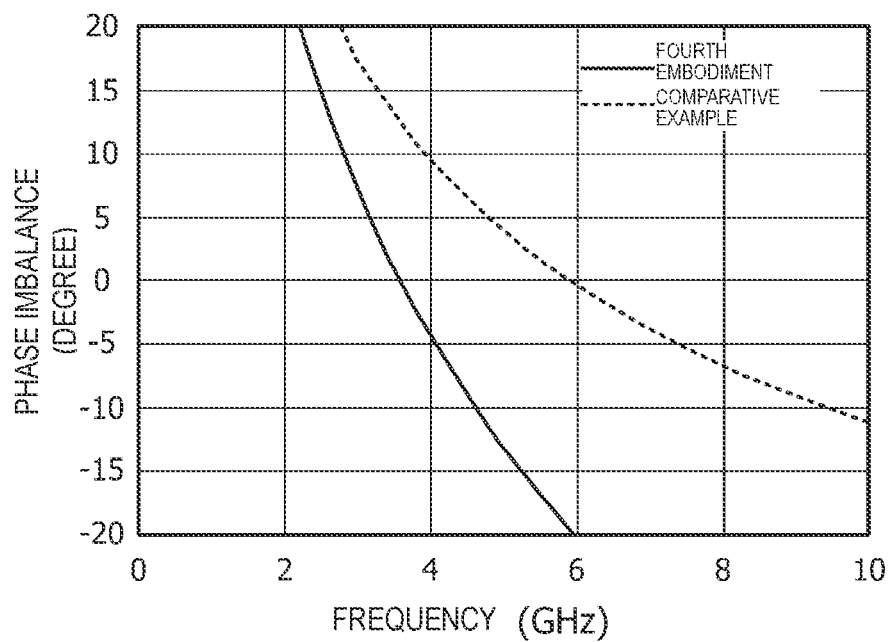
FIG. 13B is a graph depicting phase imbalances of the impedance converting circuits.

As depicted in FIG. 12A, the impedance converting circuit according to the fourth embodiment produces an improvement in the insertion loss in the frequency range approximately from 1.5 GHz to 3 GHz compared with the impedance converting circuit according to the comparative example. As depicted in FIG. 12B, the impedance converting circuit according to the fourth embodiment produces an improvement in the common-mode rejection ratio in the frequency range approximately from 2 GHz to 4.2 GHz. As depicted in FIG. 13A, the impedance converting circuit according to the fourth embodiment produces an improvement in the amplitude imbalance in the frequency range approximately from 2 GHz to 4 GHz. As depicted in FIG. 13B, the impedance converting circuit according to the fourth embodiment produces an improvement in the phase imbalance in the frequency range approximately from 3 GHz to 4 GHz.

It is confirmed from the simulation results depicted in the drawings from FIG. 12A to FIG. 13B that the characteristics of the impedance converting circuit are improved by connecting the capacitors Cp1 and Cp2 in parallel to the first primary line 11 and the second primary line 12, respectively.

Fifth Embodiment

Next, referring to FIG. 14, description will be given with regard to an impedance converting circuit according to a fifth embodiment. Description will be omitted herein with regard to the configuration that is the same as the configuration of the impedance converting circuit according to the second embodiment, which has been described with reference to the drawings from FIG. 4A to FIG. 7.

Figure 14:
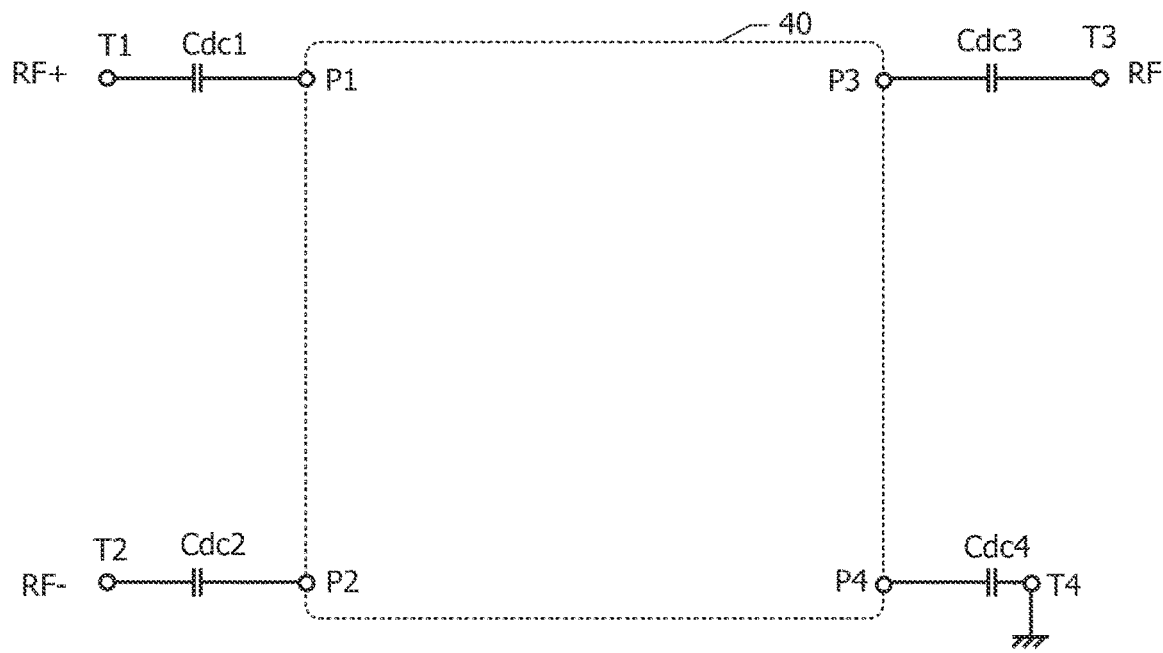
FIG. 14 is a schematic equivalent circuit diagram of an impedance converting circuit according to a fifth embodiment.

FIG. 14 is a schematic equivalent circuit diagram of the impedance converting circuit according to the fifth embodiment. In FIG. 14, a dashed line represents a transmission-line transformer 40 formed by the first primary line 11, the second primary line 12, the first secondary line 21, and the second secondary line 22 in the impedance converting circuit according to the second embodiment (FIG. 4A). The transmission-line transformer 40 includes the first node P1, the second node P2, the third node P3, and the fourth node P4 as input and output nodes for a radio-frequency signal.

In the second embodiment (FIG. 4A), the first node P1 and the third node P3 are directly connected to the first connection terminal T1 and the third connection terminal T3, respectively, and the second node P2 and the fourth node P4 are directly connected to the second connection terminal T2 and the fourth connection terminal T4, respectively. In contrast, in the fifth embodiment, capacitors Cdc1, Cdc2, Cdc3, and Cdc4 are connected in series between the first node P1 and the first connection terminal T1, between the second node P2 and the second connection terminal T2, between the third node P3 and the third connection terminal T3, and the fourth node P4 and the fourth connection terminal T4, respectively.

The first connection terminal T1 and the second connection terminal T2 are used to receive or output differential signals RF+ and RF−, and the third connection terminal T3 is used to receive or output a single-ended signal RF. The fourth connection terminal T4 is grounded.

The capacitors Cdc1, Cdc2, Cdc3, and Cdc4 each function as an impedance matching capacitor and a DC-cut capacitor.

Next, description will be given with regard to a positive effect according to the fifth embodiment.

In the fifth embodiment, connecting the capacitors Cdc1, Cdc2, Cdc3, and Cdc4 enables a direct-current component to be removed from a signal that is input into the transmission-line transformer 40 and a signal that is output from the transmission-line transformer 40. Further, by appropriately setting the capacitances of the capacitors Cdc1, Cdc2, Cdc3, and Cdc4, the input impedance of the impedance converting circuit can be adjusted to a target value.

Next, description will be given with regard to an impedance converting circuit according to a modification to the fifth embodiment. Although the capacitors Cdc1, Cdc2, Cdc3, and Cdc4 are connected to the first node P1, the second node P2, the third node P3, and the fourth node P4 in the fifth embodiment, capacitors may be connected to one of the input and output sides for a signal. Further, the configuration of the impedance converting circuit according to the first embodiment (FIG. 1A), the third embodiment (FIG. 8), or the fourth embodiment (FIG. 11) may be adopted as the transmission-line transformer 40 instead of the configuration according to the second embodiment.

Next, referring to the drawings from FIG. 15 to FIG. 19, description will be given with regard to impedance converting circuits according to various different modifications to the fifth embodiment. FIGS. 15 to 19 each depicts a schematic equivalent circuit diagram of an impedance converting circuit according to a modification to the fifth embodiment.

Figure 15:
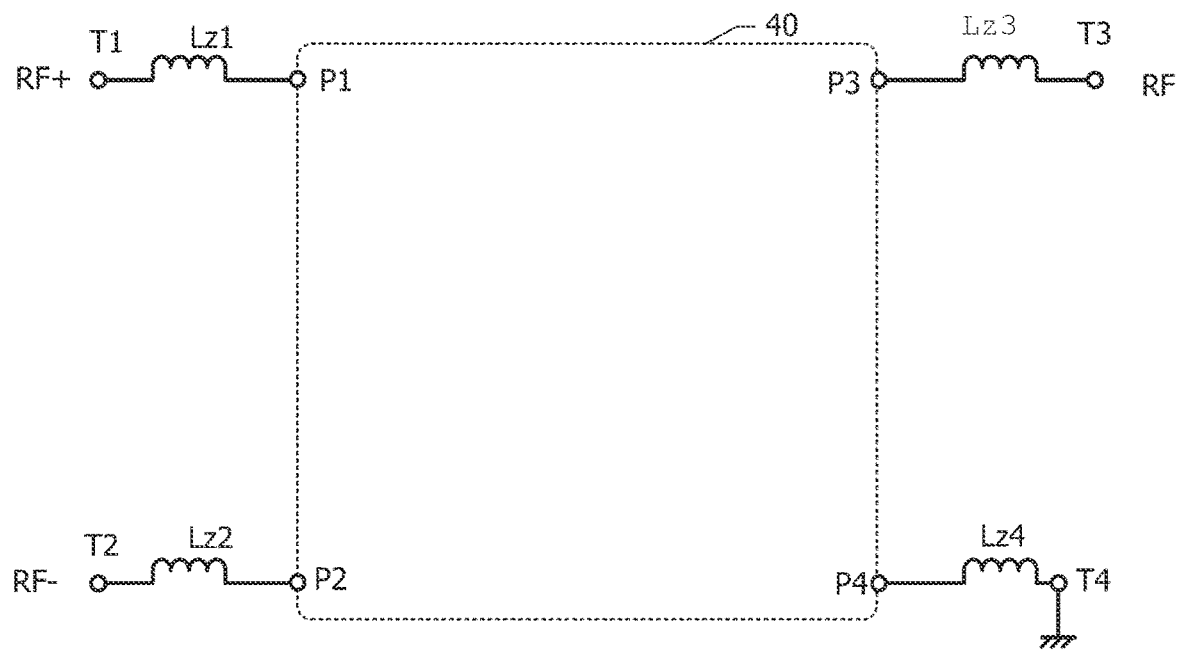
FIG. 15 is a schematic equivalent circuit diagram of an impedance converting circuit according to a modification to the fifth embodiment.

In the modification depicted in FIG. 15, inductors Lz1, Lz2, Lz3, and Lz4 are used instead of the capacitors Cdc1, Cdc2, Cdc3, and Cdc4, respectively, in the impedance converting circuit according to the fifth embodiment. The fourth node P4 can be maintained in a state of being grounded in a radio-frequency range by selecting the inductance of the inductor Lz4 and the design frequency of the impedance converting circuit so that the impedance of the inductor Lz4 is sufficiently low. In this case, the inductor Lz4 has a function of impedance matching.

Figure 16:
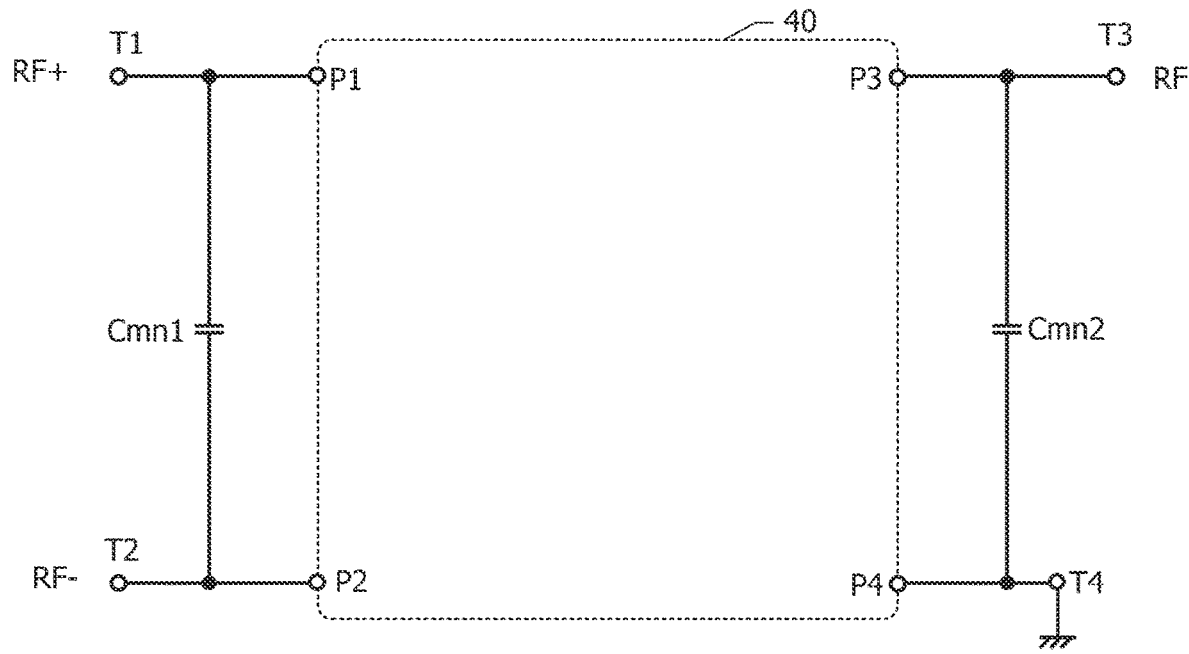
FIG. 16 is a schematic equivalent circuit diagram of an impedance converting circuit according to another modification to the fifth embodiment.

In the modification depicted in FIG. 16, a capacitor Cmn1 is connected between the first node P1 and the second node P2, and a capacitor Cmn2 is connected between the third node P3 and the fourth node P4 instead of the capacitors Cdc1, Cdc2, Cdc3, and Cdc4 in the impedance converting circuit according to the fifth embodiment (FIG. 14).

Figure 17:
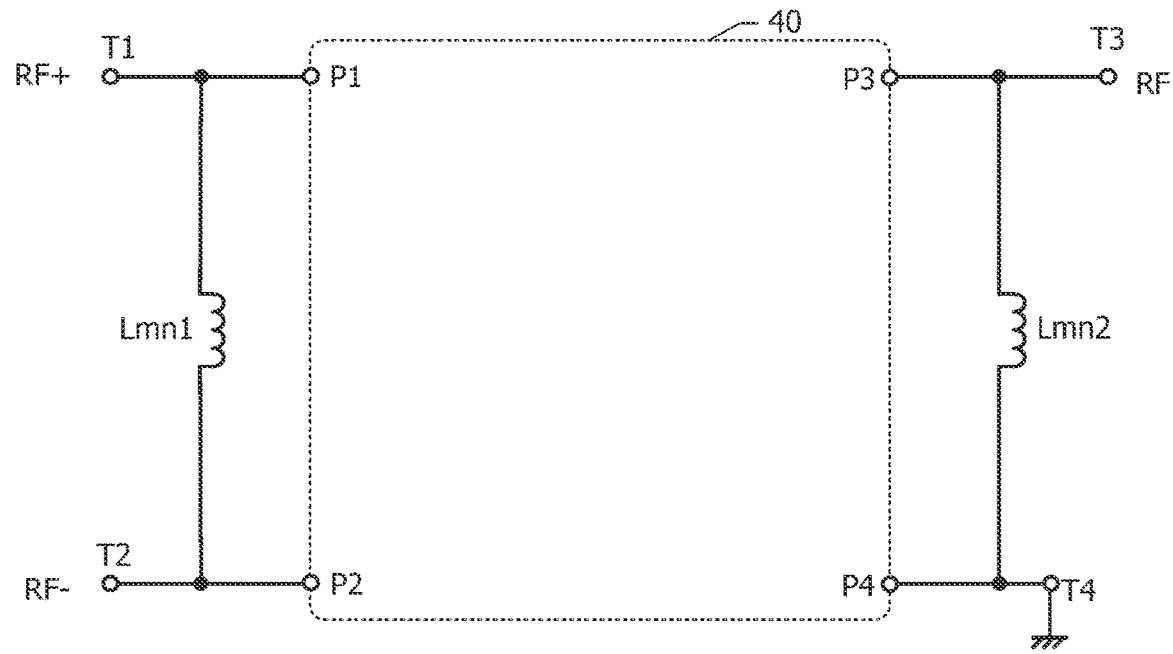
FIG. 17 is a schematic equivalent circuit diagram of an impedance converting circuit according to still another modification to the fifth embodiment.
Figure 18:
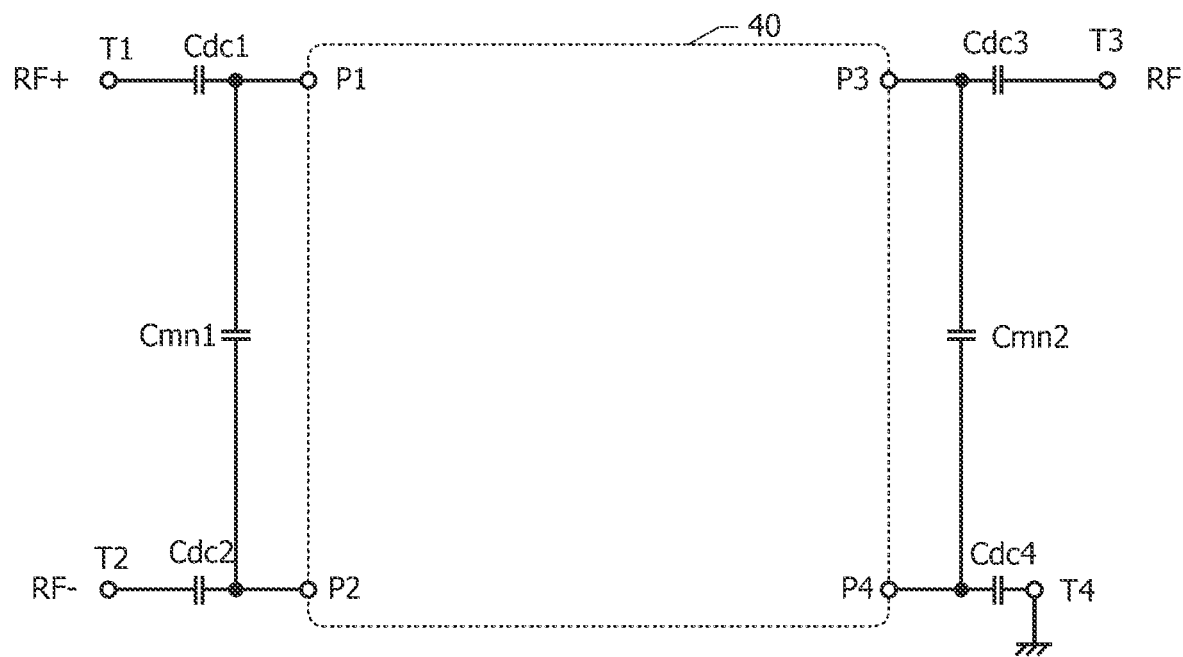
FIG. 18 is a schematic equivalent circuit diagram of an impedance converting circuit according to still another modification to the fifth embodiment.
Figure 19:
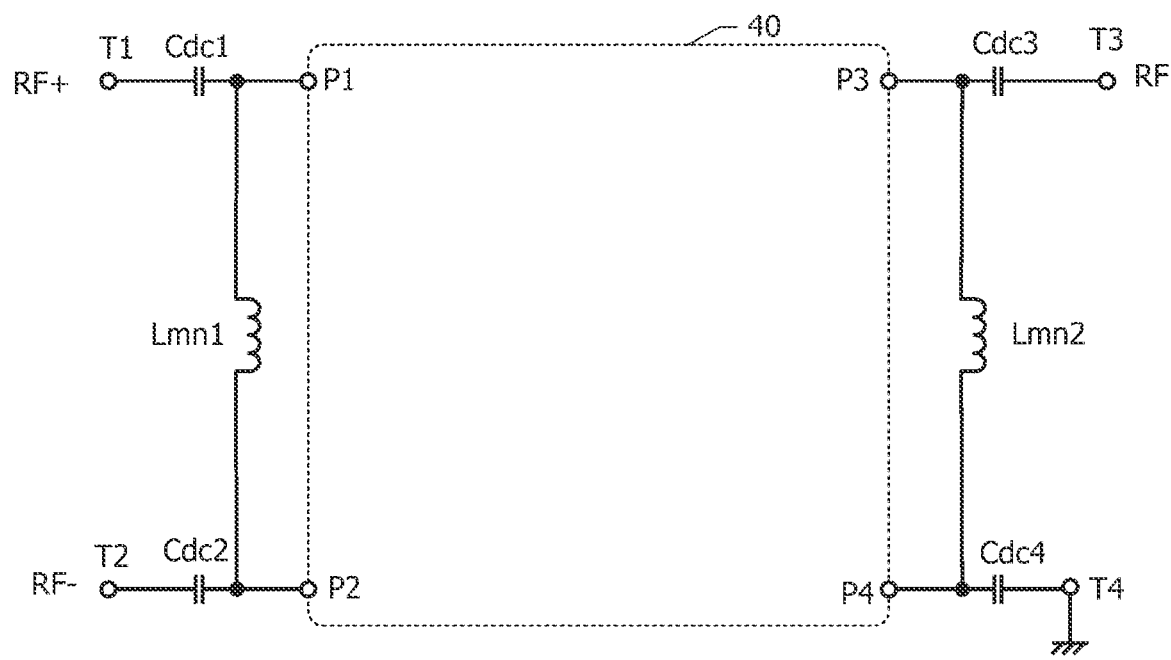
FIG. 19 is a schematic equivalent circuit diagram of an impedance converting circuit according to still another modification to the fifth embodiment.

In the modification depicted in FIG. 17, inductors Lmn1 and Lmn2 are used instead of the capacitors Cmn1 and Cmn2, respectively, in the modification depicted in FIG. 16. In the modification depicted in FIG. 18, in addition to the capacitors Cdc1, Cdc2, Cdc3, and Cdc4 in the impedance converting circuit according to the fifth embodiment (FIG. 14), the capacitor Cmn1 is further connected between the first node P1 and the second node P2, and the capacitor Cmn2 is further connected between the third node P3 and the fourth node P4. In the modification depicted in FIG. 19, the inductors Lmn1 and Lmn2 are used instead of the capacitors Cmn1 and Cmn2, respectively, in the modification depicted in FIG. 18.

As in the above modifications, the impedance converting circuit may include at least one of a series reactance element connected in series between the first node P1 and the first connection terminal T1, a series reactance element connected in series between the second node P2 and the second connection terminal T2, a series reactance element connected in series between the third node P3 and the third connection terminal T3, and a series reactance element connected in series between the fourth node P4 and the fourth connection terminal T4. Further, the impedance converting circuit may include at least one of a reactance element connected between the first node P1 and the second node P2 and a reactance element connected between the third node P3 and the fourth node P4, both of the reactance elements being connected in parallel to the transmission-line transformer 40. By adjusting the capacitances or inductances of these reactance elements, the input impedance of the impedance converting circuit can be adjusted to a target value.

Sixth Embodiment

Next, referring to FIG. 20, description will be given with regard to an amplifier module according to a sixth embodiment. The amplifier module according to the sixth embodiment includes the impedance converting circuit according to the second embodiment (FIG. 4A). Description will be omitted herein with regard to the configuration that is the same as the configuration of the impedance converting circuit according to the second embodiment, which has been described with reference to the drawings from FIG. 4A to FIG. 6B.

Figure 20:
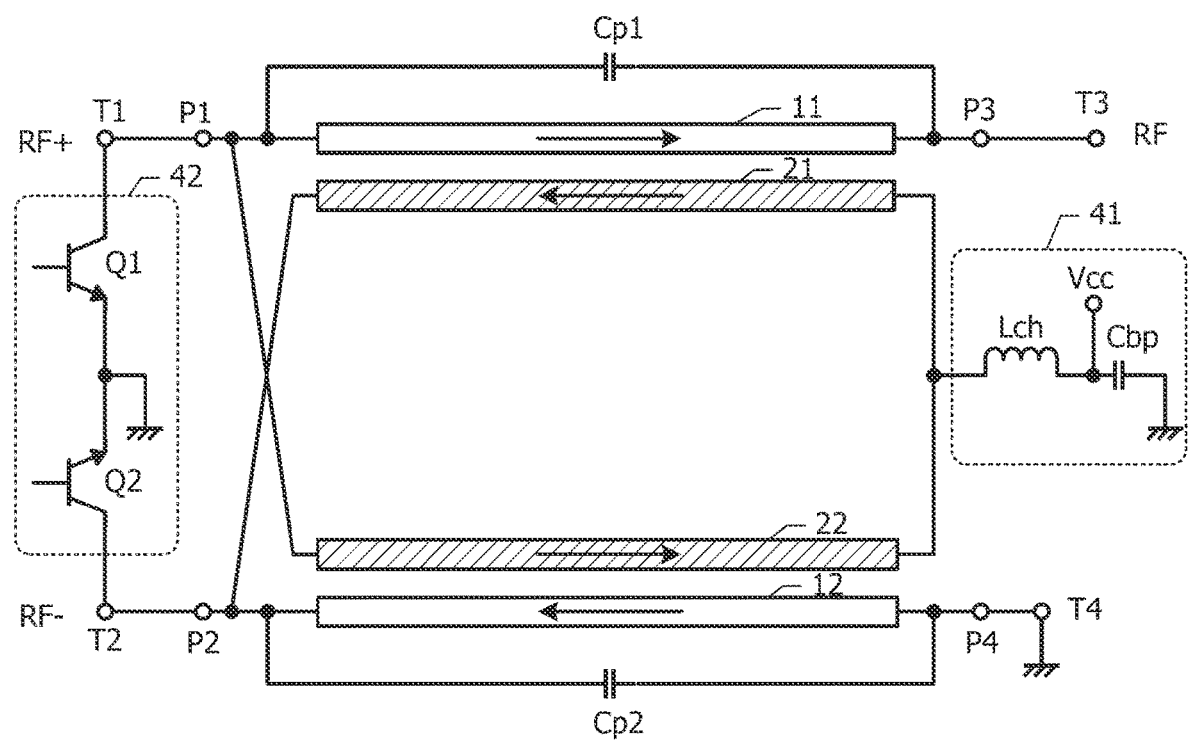
FIG. 20 is an equivalent circuit diagram of an impedance converting circuit according to a sixth embodiment.

FIG. 20 is an equivalent circuit diagram of an impedance converting circuit according to the sixth embodiment. In the impedance converting circuit according to the sixth embodiment, a power supply circuit 41 is connected to the node at which the first secondary line 21 and the second secondary line 22 are connected. The power supply circuit 41 includes a choke coil Lch, a bypass capacitor Cbp, and a power supply terminal Vcc.

The node at which the first secondary line 21 and the second secondary line 22 are connected is connected to the power supply terminal Vcc with the choke coil Lch interposed therebetween. A power supply voltage is applied to the power supply terminal Vcc by an external power source circuit. A bypass capacitor Cbp is connected between the power supply terminal Vcc and the ground.

A pair of output terminals of a differential amplifier 42 are respectively connected to the first connection terminal T1 and the second connection terminal T2. For example, the differential amplifier 42 includes grounded-emitter bipolar transistors Q1 and Q2, and the collectors of the bipolar transistors Q1 and Q2 are connected to the first connection terminal T1 and the second connection terminal T2, respectively.

The power supply voltage is applied to the collector of the bipolar transistor Q1 from the power supply terminal Vcc via the choke coil Lch and the second secondary line 22. Further, the power supply voltage is applied to the collector of the bipolar transistor Q2 from the power supply terminal Vcc via the choke coil Lch and the first secondary line 21.

Next, description will be given with regard to a positive effect according to the sixth embodiment.

In the sixth embodiment, power can be supplied to the differential amplifier 42 connected to the first connection terminal T1 and the second connection terminal T2 via the impedance converting circuit. Further, power can be supplied to the two bipolar transistors Q1 and Q2 via the single choke coil Lch.

Next, referring to FIG. 21, description will be given with regard to an impedance converting circuit according to a modification to the sixth embodiment.

Figure 21:
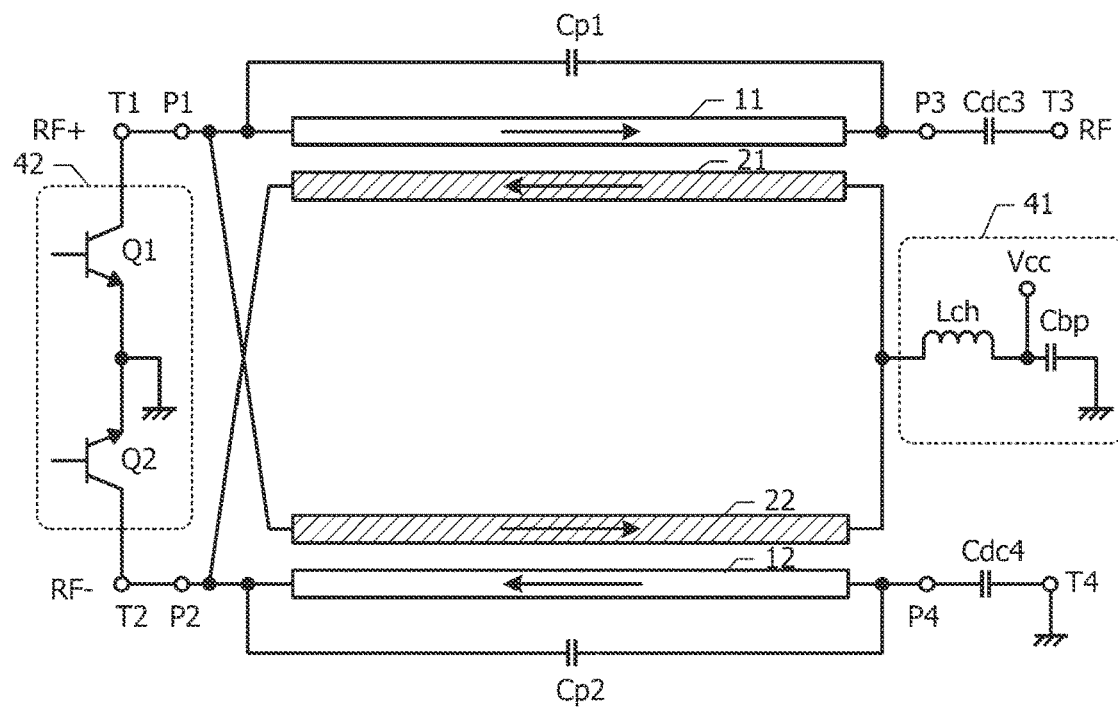
FIG. 21 is an equivalent circuit diagram of an impedance converting circuit according to a modification to the sixth embodiment.

FIG. 21 is an equivalent circuit diagram of the impedance converting circuit according to the modification to the sixth embodiment. In the present modification, the capacitor Cdc3 is connected in series between the third node P3 and the third connection terminal T3, and the capacitor Cdc4 is connected in series between the fourth node P4 and the fourth connection terminal T4 (ground). The impedance seen at the differential amplifier 42 looking into the load side can be adjusted by inserting the capacitors Cdc3 and Cdc4.

Seventh Embodiment

Next, referring to FIG. 22, description will be given with regard to an impedance converting circuit according to a seventh embodiment. Description will be omitted herein with regard to the configuration that is the same as the configuration of the impedance converting circuit according to the sixth embodiment, which has been described with reference to FIG. 20.

Figure 22:
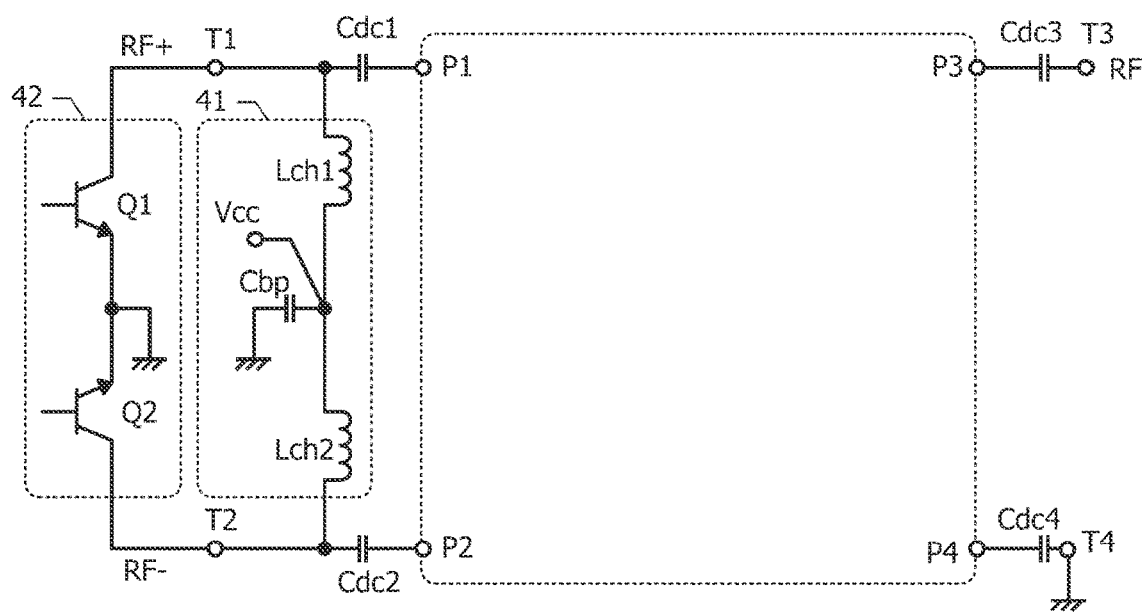
FIG. 22 is a schematic equivalent circuit diagram of an impedance converting circuit according to a seventh embodiment.

FIG. 22 is a schematic equivalent circuit diagram of the impedance converting circuit according to the seventh embodiment. In the sixth embodiment (FIG. 20), the power supply circuit 41 is connected to the node at which the first secondary line 21 and the second secondary line 22 are connected. In contrast, in the seventh embodiment, the power supply circuit 41 is connected to the first connection terminal T1 and the second connection terminal T2 on the differential signal input side.

For example, the power supply terminal Vcc is connected to the first connection terminal T1 and the second connection terminal T2 with choke coils Lch1 and Lch2, respectively, interposed therebetween. The power supply terminal Vcc is further connected to the ground with the bypass capacitor Cbp interposed therebetween. In the sixth embodiment (FIG. 20), the first connection terminal T1 and the first node P1 are directly connected, and the second connection terminal T2 and the second node P2 are directly connected. In contrast, in the seventh embodiment, the capacitor Cdc1 is connected in series between the first connection terminal T1 and the first node P1, and the capacitor Cdc2 is connected in series between the second connection terminal T2 and the second node P2. Further, similarly to the modification to the sixth embodiment (FIG. 21), the capacitor Cdc3 is connected between the third node P3 and the third connection terminal T3, and the capacitor Cdc4 is connected between the fourth node P4 and the fourth connection terminal T4.

Next, description will be given with regard to a positive effect according to the seventh embodiment.

In the seventh embodiment, power can be supplied to the differential amplifier 42 from the power supply circuit 41 connected to the first connection terminal T1 and the second connection terminal T2 of the impedance converting circuit. In the sixth embodiment, since power is supplied to the differential amplifier 42 via the first secondary line 21 and the second secondary line 22, a capacitor can be connected in series neither between the differential amplifier 42 and the first node P1 nor between the differential amplifier 42 and the second node P2. In contrast, in the seventh embodiment, the capacitor Cdc1 can be connected in series between the differential amplifier 42 and the first node P1, and the capacitor Cdc2 can be connected in series between the differential amplifier 42 and the second node P2. Thus, a positive effect of enhanced flexibility in impedance adjustment is obtained.

Eighth Embodiment

Next, referring to the drawings from FIG. 23 to FIG. 25B, description will be given with regard to an impedance converting circuit according to an eighth embodiment. Description will be omitted herein with regard to the configuration that is the same as the configuration of the impedance converting circuit according to the second embodiment, which has been described with reference to the drawings from FIG. 4A to FIG. 6B.

Figure 23:
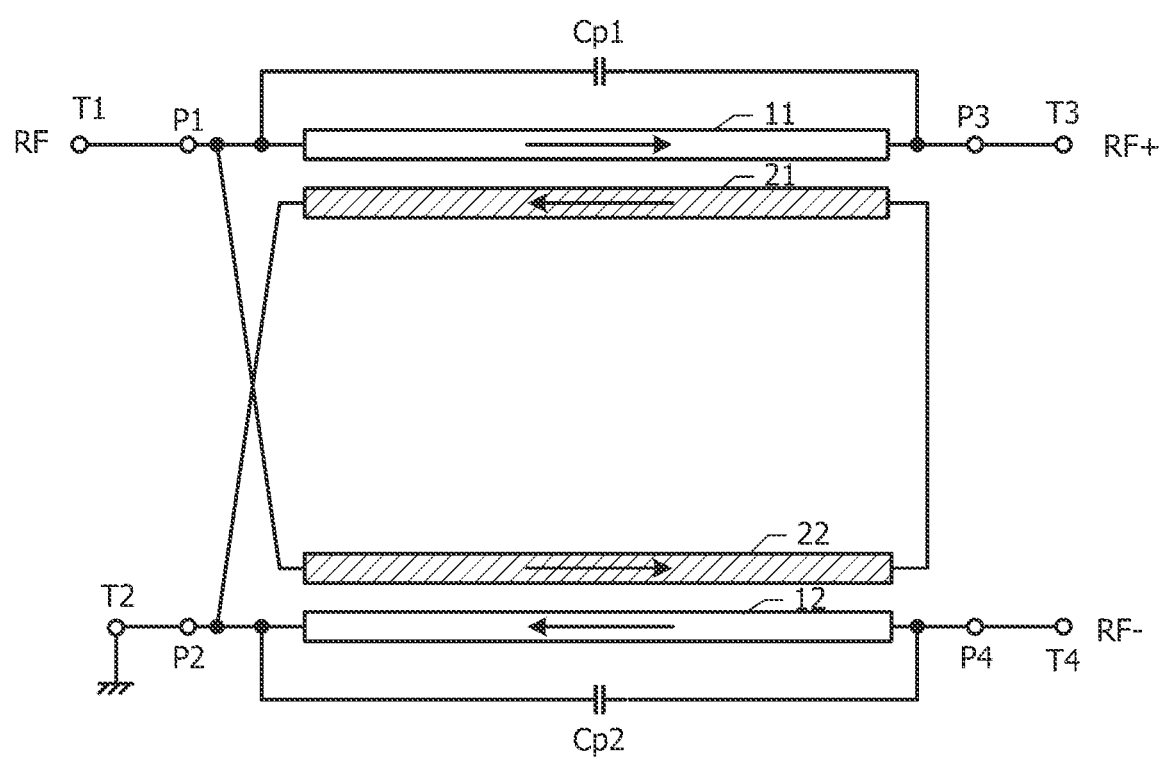
FIG. 23 is an equivalent circuit diagram of an impedance converting circuit according to an eighth embodiment.

FIG. 23 is an equivalent circuit diagram of the impedance converting circuit according to the eighth embodiment. In the second embodiment (FIG. 4A), the fourth connection terminal T4 connected to the fourth node P4 is specified as the ground terminal, and the fourth node P4 is grounded. In contrast, in the eighth embodiment, the second connection terminal T2 connected to the second node P2 is specified as the ground terminal, and the second node P2 is grounded.

In the eighth embodiment, the first connection terminal T1 is used as the input and output terminal for the single-ended signal RF, and the third connection terminal T3 and the fourth connection terminal T4 are used as the input and output terminals for the differential signals RF+ and RF−. In the second embodiment (FIG. 4A), in the case where the differential signals RF+ and RF− are converted into the single-ended signal RF, the impedance looking into the load side is converted into ¼ of the load impedance, and in the case where the single-ended signal RF is converted into the differential signals RF+ and RF−, the impedance looking into the load side is converted into four times the load impedance. In contrast, in the eighth embodiment, conversely, in the case where the differential signals RF+ and RF− are converted into the single-ended signal RF, the impedance looking into the load side is converted into four times the load impedance, and in the case where the single-ended signal RF is converted into the differential signals RF+ and RF−, the impedance looking into the load side is converted into ¼ of the load impedance.

Next, description will be given with regard to a positive effect according to the eighth embodiment. In the eighth embodiment, similarly to the second embodiment, sufficient isolation can also be obtained between the fourth node P4 and the second node P2 (ground) because of the capacitor Cp2 connected in parallel to the second primary line 12. Further, the symmetry between the first primary line 11 and the second primary line 12 can be maintained because the capacitor Cp1 is also connected in parallel to the first primary line 11.

Next, referring to the drawings from FIG. 24A to FIG. 25B, description will be given with regard to results of simulation performed to verify a positive effect according to the eighth embodiment. The first primary line 11, the second primary line 12, the first secondary line 21, and the second secondary line 22 of an impedance converting circuit used for simulation are each assumed to be 2000 μm long and 25 μm wide. The capacitances of the capacitors Cp1 and Cp2 are assumed to be 0.7 pF. Other simulation conditions are the same as the simulation conditions in FIG. 1C in the first embodiment.

Similarly to FIGS. 5A, 5B, 6A, and 6B in the second embodiment, FIGS. 24A, 24B, 25A, and 25B present graphs depicting insertion losses, common-mode rejection ratios, amplitude imbalances, and phase imbalances, respectively, of the impedance converting circuits. The solid lines and the dashed lines represent simulation results for the impedance converting circuits according to the eighth embodiment and a comparative example, respectively, in the graphs in FIGS. 24A, 24B, 25A, and 25B, and the comparative example includes neither the capacitor Cp1 nor the capacitor Cp2. The insertion loss depicted in FIG. 24A indicates an insertion loss obtained when the third connection terminal T3 and the fourth connection terminal T4 are driven with differential signals RF+ and RF− and a single-ended signal is output from the first connection terminal T1.

Figure 24A:
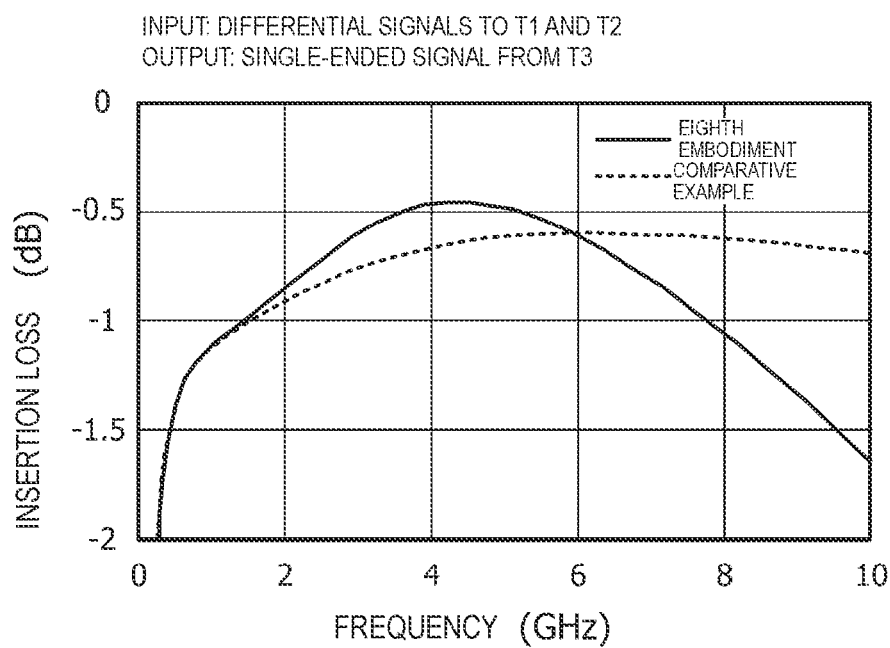
FIG. 24A is a graph depicting insertion losses of the impedance converting circuits according to the eighth embodiment and a comparative example.
Figure 24B:
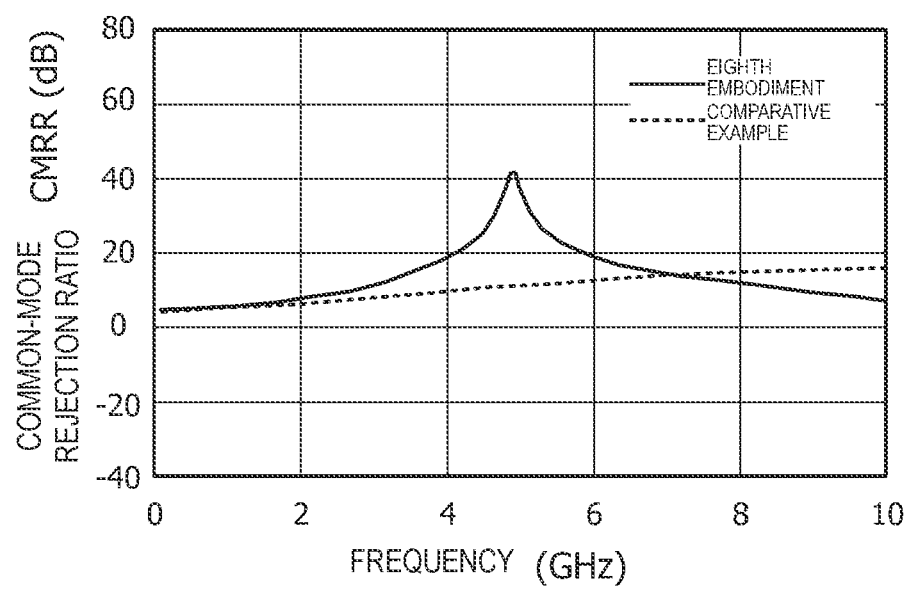
FIG. 24B is a graph depicting common-mode rejection ratios of the impedance converting circuits.
Figure 25A:
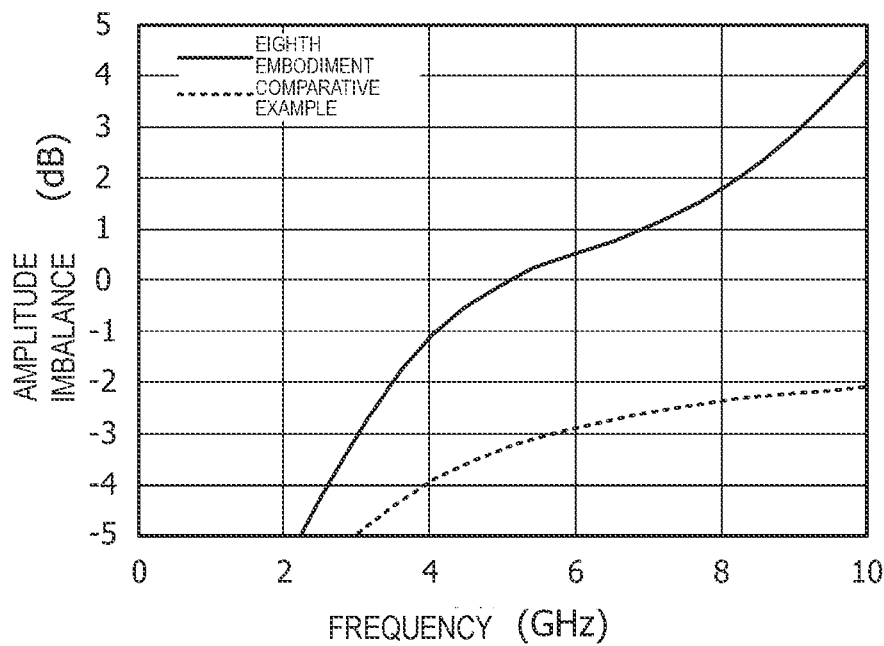
FIG. 25A is a graph depicting amplitude imbalances of the impedance converting circuits according to the eighth embodiment and the comparative example.
Figure 25B:
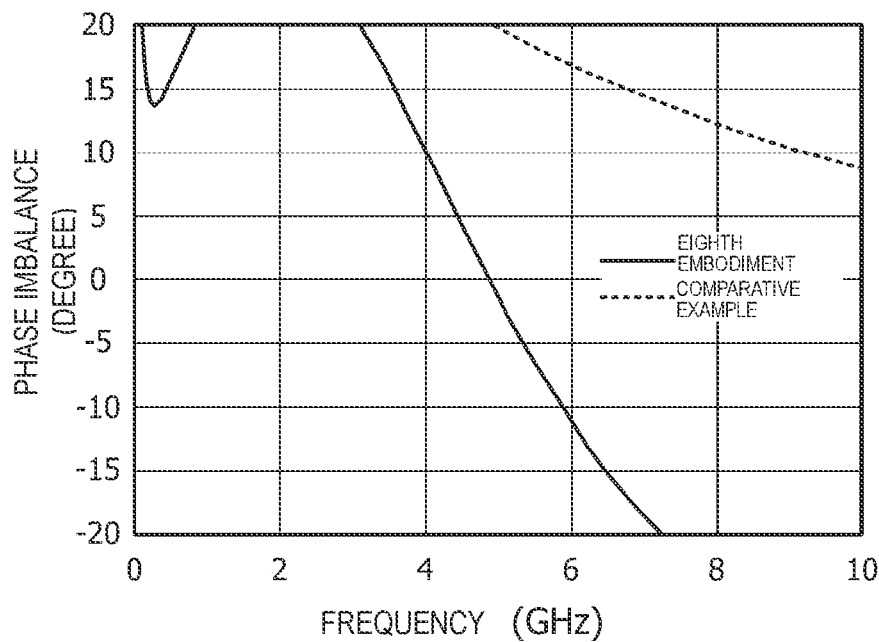
FIG. 25B is a graph depicting phase imbalances of the impedance converting circuits.

As depicted in FIG. 24A, the impedance converting circuit according to the eighth embodiment produces an improvement in the insertion loss in the frequency range approximately from 1.5 GHz to 6 GHz compared with the impedance converting circuit according to the comparative example. As depicted in FIG. 24B, the impedance converting circuit according to the eighth embodiment produces an improvement in the common-mode rejection ratio in the frequency range approximately from 2 GHz to 7 GHz. As depicted in FIG. 25A, the impedance converting circuit according to the eighth embodiment produces an improvement in the amplitude imbalance in the frequency range approximately from 3 GHz to 8 GHz. As depicted in FIG. 25B, the impedance converting circuit according to the eighth embodiment produces an improvement in the phase imbalance in the frequency range approximately from 3 GHz to 6 GHz.

It is confirmed from the simulation results depicted in the drawings from FIG. 24A to FIG. 25B that the characteristics of the impedance converting circuit are also improved in the configuration in which the second node P2 is grounded.

Ninth Embodiment

Next, referring to FIG. 26, description will be given with regard to an impedance converting circuit according to a ninth embodiment. Description will be omitted herein with regard to the configuration that is the same as the configuration of the impedance converting circuit according to the second embodiment, which has been described with reference to the drawings from FIG. 4A to FIG. 6B.

Figure 26:
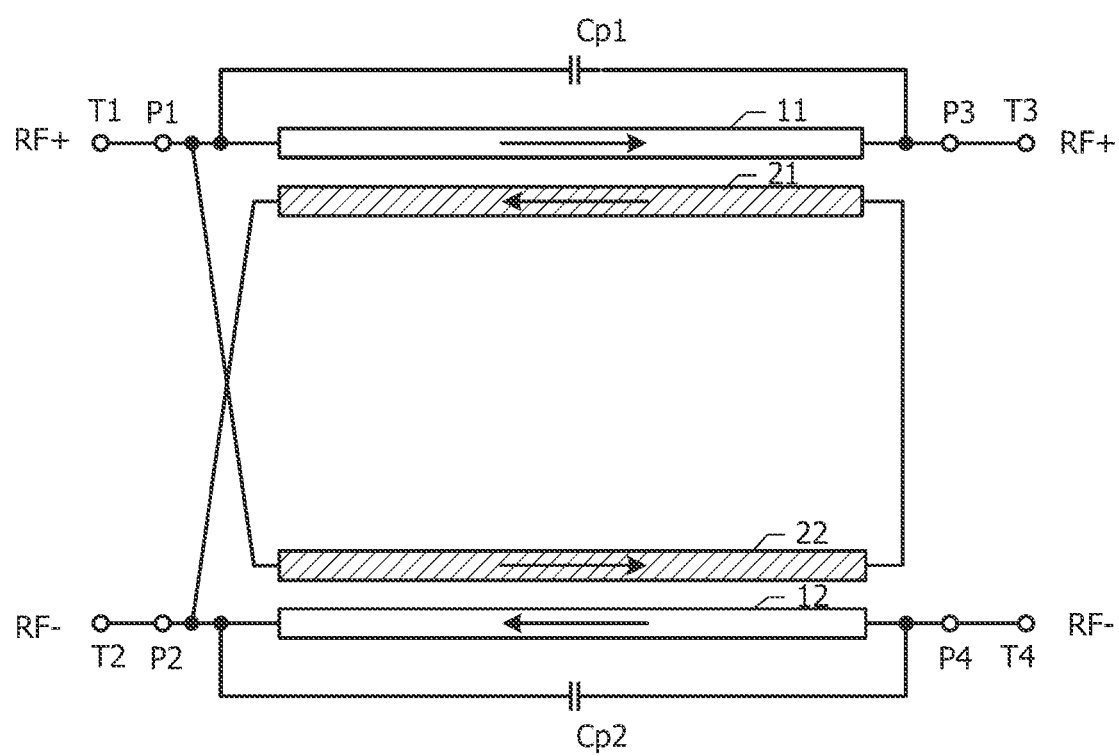
FIG. 26 is an equivalent circuit diagram of an impedance converting circuit according to a ninth embodiment.

FIG. 26 is an equivalent circuit diagram of the impedance converting circuit according to the ninth embodiment. The impedance converting circuit in the second embodiment (FIG. 4A) is configured to function as a balanced-unbalanced converting circuit with the fourth node P4 grounded. In contrast, no node in the impedance converting circuit according to the ninth embodiment is grounded. A terminal pair formed by the first connection terminal T1 and the second connection terminal T2 and a terminal pair formed by the third connection terminal T3 and the fourth connection terminal T4 are both used as the input and output terminals for the differential signals RF+ and RF−. In other words, the impedance converting circuit according to the ninth embodiment operates as an impedance converting circuit having terminals for differential signals both on the input side and on the output side.

Next, description will be given with regard to a positive effect according to the ninth embodiment.

In the ninth embodiment, connecting the capacitor Cp1 in parallel to the first primary line 11 can achieve high isolation between the first node P1 and the third node P3 in a frequency range including the resonant frequency of parallel resonance. Connecting the capacitor Cp2 in parallel to the second primary line 12 can achieve high isolation between the second node P2 and the fourth node P4 in a frequency range including the resonant frequency of parallel resonance.

Tenth Embodiment

Next, referring to FIGS. 27A and 27B, description will be given with regard to a tenth embodiment. Description will be omitted herein with regard to the configuration that is the same as the configuration of the impedance converting circuit according to the first embodiment, which has been described with reference to the drawings from FIG. 1A to FIG. 1C.

Figure 27A:
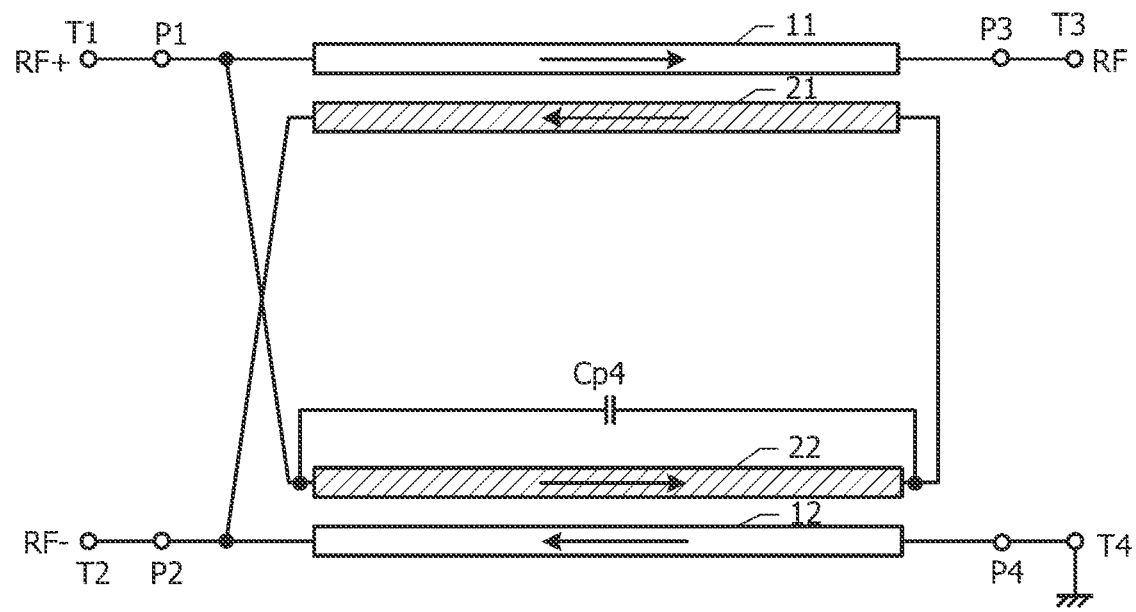
FIG. 27A is an equivalent circuit diagram of an impedance converting circuit according to a tenth embodiment.

FIG. 27A is an equivalent circuit diagram of an impedance converting circuit according to the tenth embodiment. In the first embodiment (FIG. 1A), the capacitor Cp2 is connected in parallel to the second primary line 12. In contrast, in the tenth embodiment, a capacitor Cp4 is connected in parallel to the second secondary line 22.

Next, description will be given with regard to a positive effect according to the tenth embodiment.

Since the capacitor Cp4 is connected in parallel to the second secondary line 22, parallel resonance is caused at a certain frequency by the capacitor Cp4 and the inductance component of the second secondary line 22. High impedance is obtained between both ends of the second secondary line 22 in a frequency range including this resonant frequency. Consequently, high impedance is obtained between the second node P2 and the fourth node P4 (ground), which are both ends of the second primary line 12, which is configured to be electromagnetically coupled to the second secondary line 22. As a result, sufficient isolation between the second node P2 and the ground can be obtained.

Figure 27B:
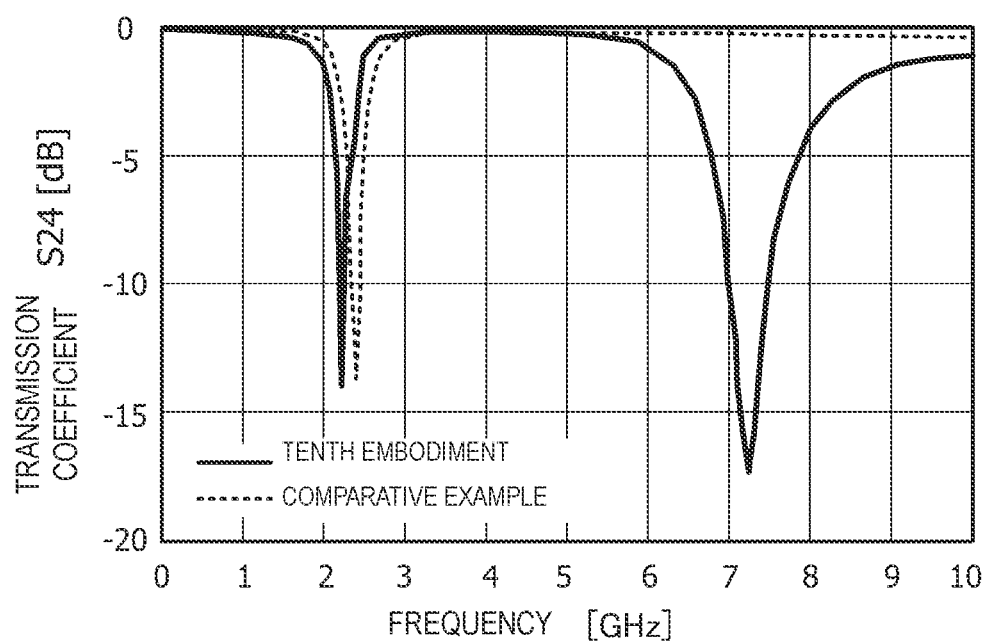
FIG. 27B is a graph depicting transmission coefficients S24 for the transmission from the fourth node P4 to the second node P2.

FIG. 27B is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit according to the tenth embodiment, and the dashed line represents a simulation result for an impedance converting circuit without necessarily the capacitor Cp4 according to a comparative example.

Simulation conditions other than the condition related to the capacitor are the same as the simulation conditions for the first embodiment, which have been described with reference to FIG. 1C. The capacitance of the capacitor Cp4 is assumed to be 0.7 pF.

In the comparative example, isolation between the second node P2 and the fourth node P4 is obtained only in the vicinity of a frequency of 2.5 GHz. In contrast, in the case where the capacitor Cp4 is connected, isolation is also obtained in the vicinity of a frequency of 7.3 GHz. Accordingly, sufficient isolation between the second node P2 and the fourth node P4 can also be obtained when the impedance converting circuit is operated in the vicinity of a frequency of 7.3 GHz.

Next, referring to FIGS. 28A and 28B, description will be given with regard to a first modification to the tenth embodiment.

Figure 28A:
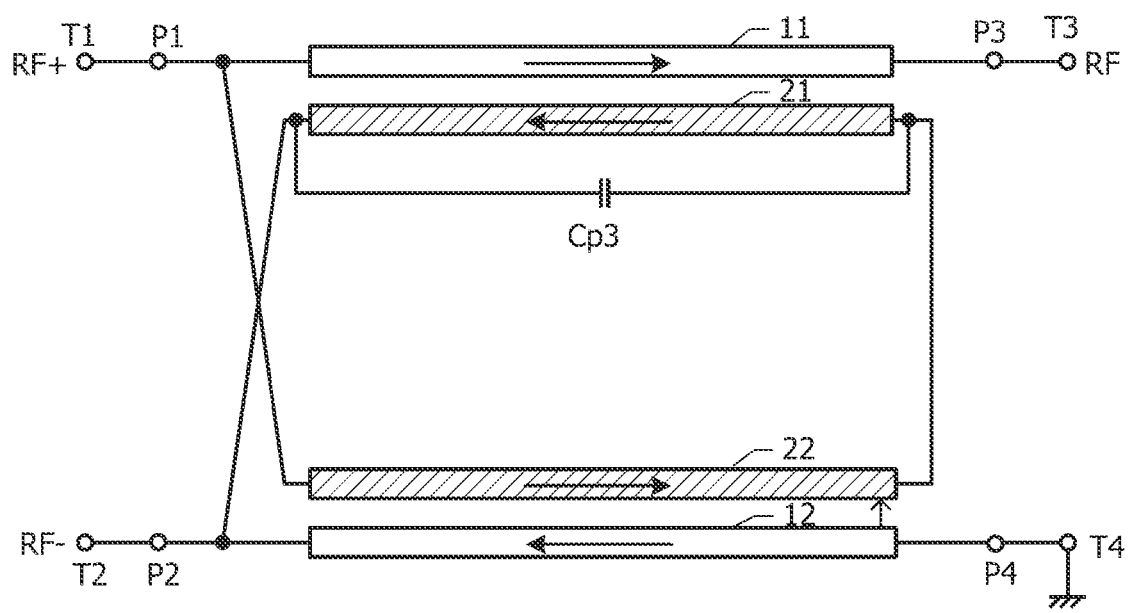
FIG. 28A is an equivalent circuit diagram of an impedance converting circuit according to a first modification to the tenth embodiment.

FIG. 28A is an equivalent circuit diagram of an impedance converting circuit according to the first modification to the tenth embodiment. In the present modification, the capacitor Cp4 (FIG. 27A) is not connected, and a capacitor Cp3 is connected in parallel to the first secondary line 21.

Figure 28B:
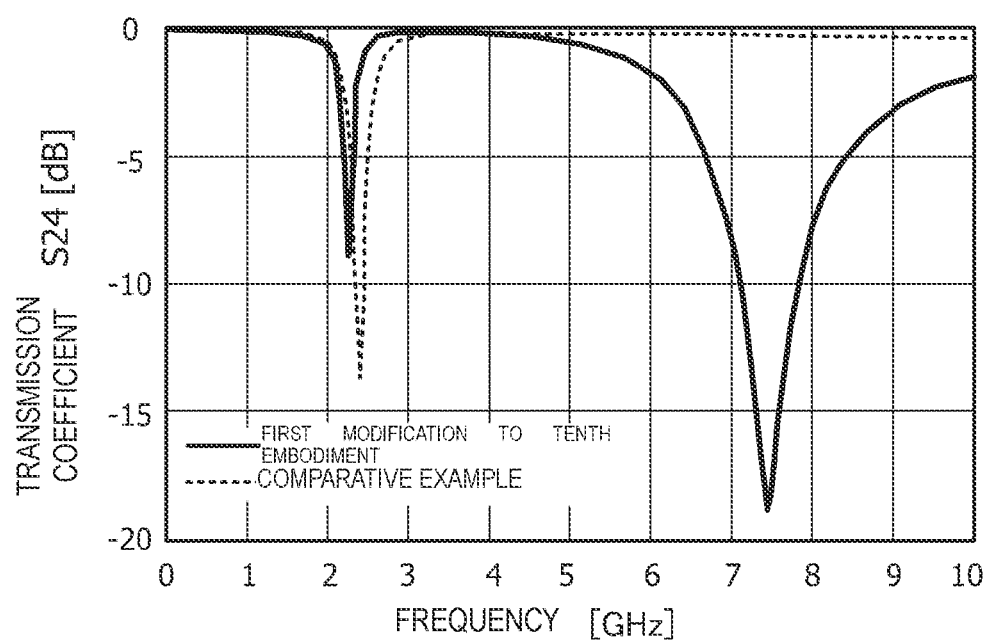
FIG. 28B is a graph depicting simulation results of the transmission coefficient S24 for the transmission from the fourth node P4 to the second node P2.

FIG. 28B is a graph depicting simulation results of the transmission coefficient S24 for the transmission from the fourth node P4 to the second node P2. The horizontal axis represents a frequency in the unit "GHz", and the vertical axis represents the transmission coefficient S24 in the unit "dB". The solid line in the graph represents a simulation result for the impedance converting circuit according to the first modification to the tenth embodiment, and the dashed line represents a simulation result for an impedance converting circuit without necessarily the capacitor Cp3 according to a comparative example.

Simulation conditions other than the condition related to the capacitor are the same as the simulation conditions for the first embodiment, which have been described with reference to FIG. 1C. The capacitance of the capacitor Cp3 is assumed to be 0.7 pF.

It can be seen that isolation is also obtained in the vicinity of a frequency of 7.5 GHz in the first modification to the tenth embodiment.

Next, referring to the drawings from FIG. 29 to FIG. 31B, description will be given with regard to an impedance converting circuit according to a second modification to the tenth embodiment.

Figure 29:
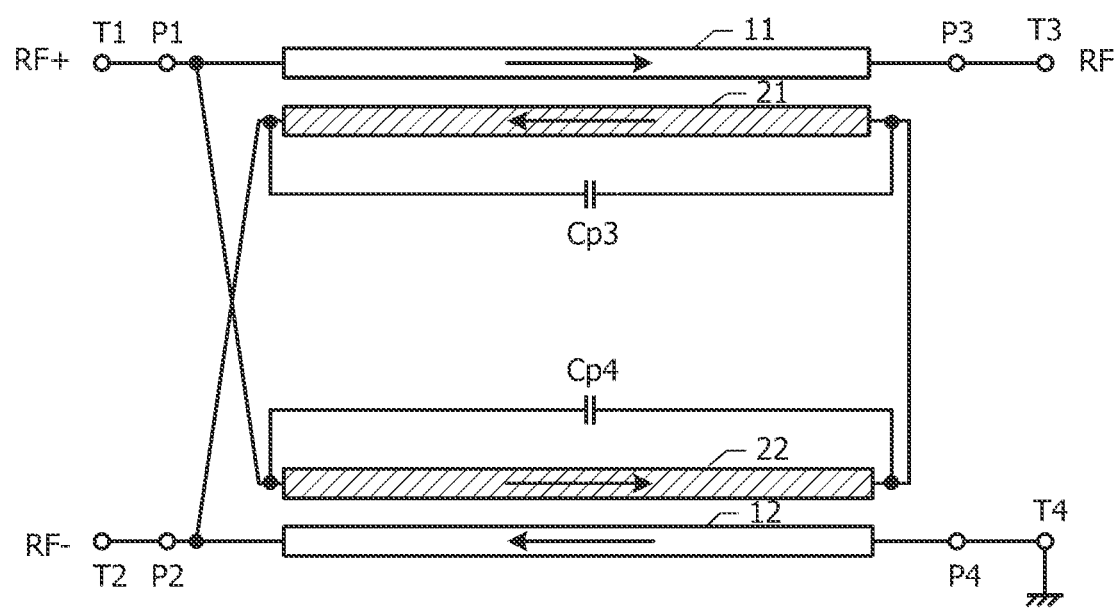
FIG. 29 is an equivalent circuit diagram of an impedance converting circuit according to a second modification to the tenth embodiment.

FIG. 29 is an equivalent circuit diagram of the impedance converting circuit according to the second modification to the tenth embodiment. In the tenth embodiment (FIG. 27A), the capacitor Cp4 is connected in parallel to the second secondary line 22. In the present modification, a capacitor Cp3 is further connected in parallel to the first secondary line 21.

Next, description will be given with regard to a positive effect according to the second modification to the tenth embodiment. Similarly to the tenth embodiment, isolation between the second node P2 and the ground can be obtained in the second modification to the tenth embodiment. Further, the symmetry between a coupled transmission line formed by the first primary line 11 and the first secondary line 21 and a coupled transmission line formed by the second primary line 12 and the second secondary line 22 can be maintained because the capacitors Cp3 and Cp4 are connected in parallel to the first secondary line 21 and the second secondary line 22, respectively.

Next, referring to the drawings from FIG. 30A to FIG. 31B, description will be given with regard to results of simulation performed to verify a positive effect according to the second modification to the tenth embodiment. The first primary line 11, the second primary line 12, the first secondary line 21, and the second secondary line 22 of an impedance converting circuit used for simulation are assumed to be 2000 μm long and 25 μm wide. The capacitances of the capacitors Cp3 and Cp4 are assumed to be 0.7 pF.

Similarly to FIGS. 5A, 5B, 6A, and 6B in the second embodiment, FIGS. 30A, 30B, 31A, and 31B present graphs depicting insertion losses, common-mode rejection ratios, amplitude imbalances, and phase imbalances, respectively, of the impedance converting circuits. The solid lines and the dashed lines in these graphs represent simulation results for the impedance converting circuits according to the second modification to the tenth embodiment and a comparative example, respectively, and the comparative example includes neither the capacitor Cp3 nor the capacitor Cp4.

Figure 30A:
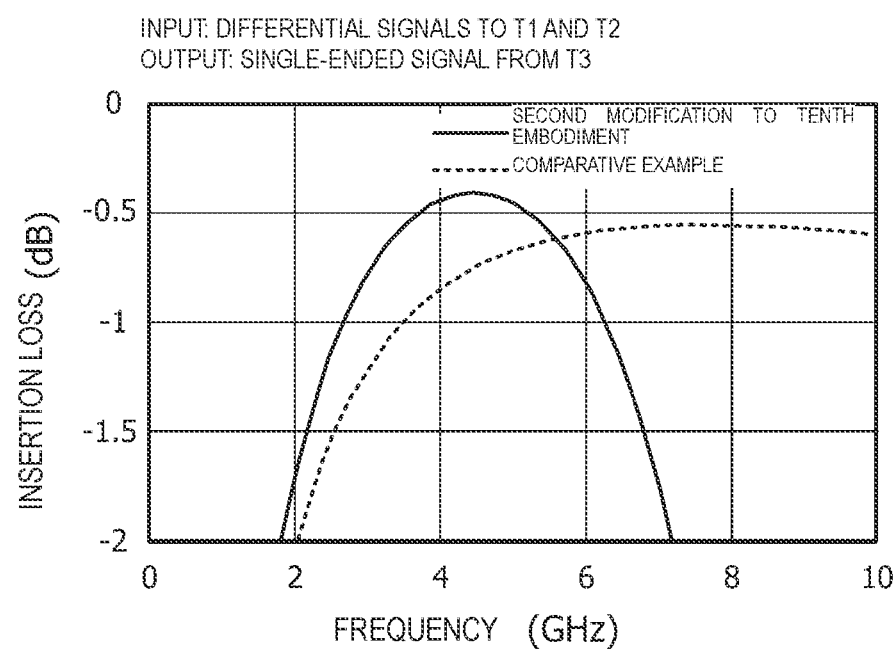
FIG. 30A is a graph depicting insertion losses of the impedance converting circuits according to the second modification to the tenth embodiment and a comparative example.
Figure 30B:
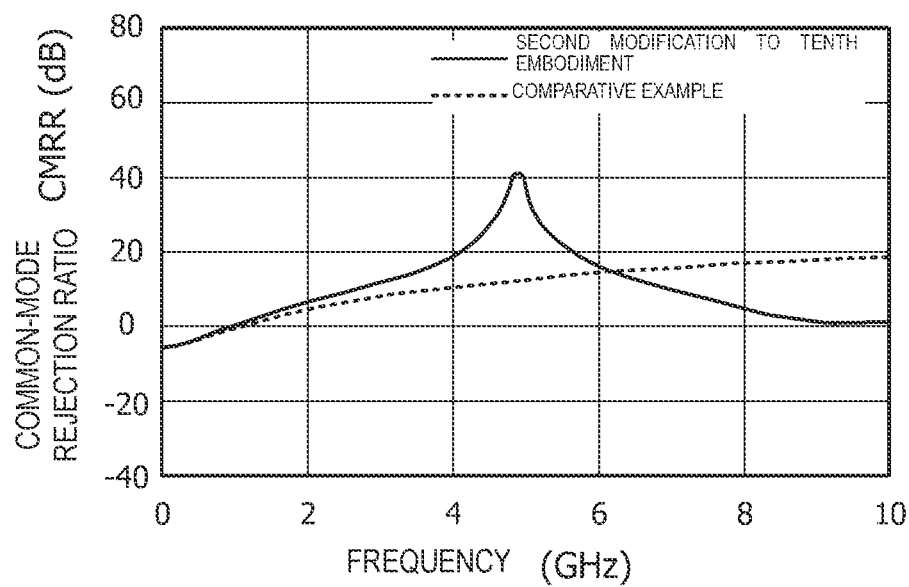
FIG. 30B is a graph depicting common-mode rejection ratios of the impedance converting circuits.
Figure 31A:
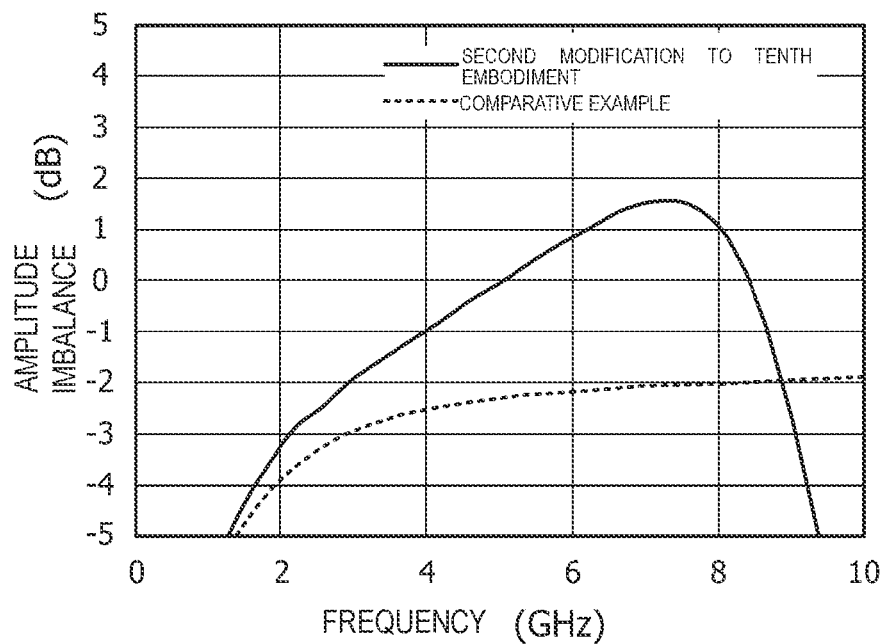
FIG. 31A is a graph depicting amplitude imbalances of the impedance converting circuits according to the second modification to the tenth embodiment and the comparative example.
Figure 31B:
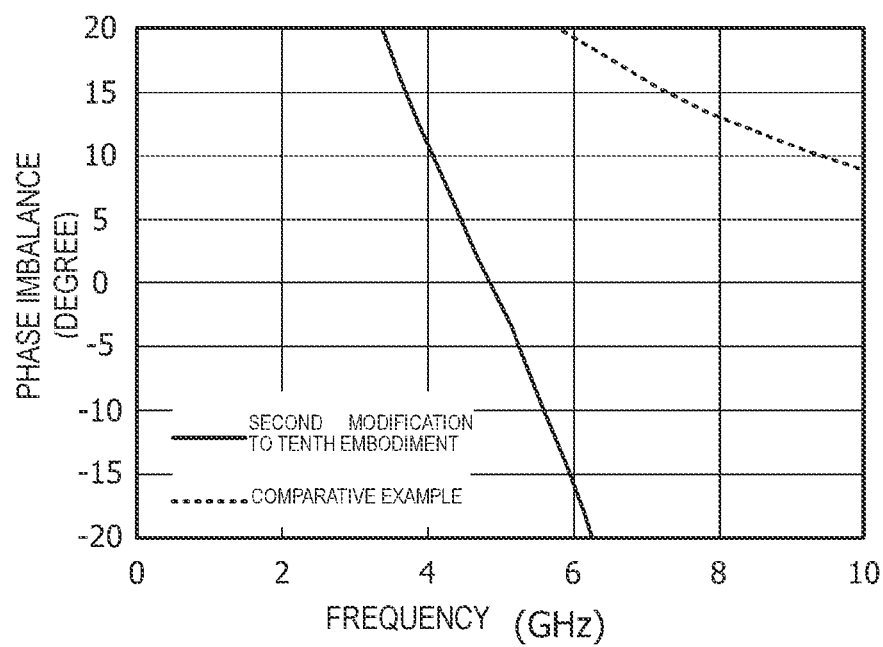
FIG. 31B is a graph depicting phase imbalances of the impedance converting circuits.

As depicted in FIG. 30A, the impedance converting circuit according to the second modification to the tenth embodiment produces an improvement in the insertion loss in the frequency range approximately from 2 GHz to 5.5 GHz compared with the impedance converting circuit according to the comparative example. As depicted in FIG. 30B, the impedance converting circuit according to the second modification to the tenth embodiment produces an improvement in the common-mode rejection ratio in the frequency range approximately from 2 GHz to 5.5 GHz. As depicted in FIG. 31A, the impedance converting circuit according to the second modification to the tenth embodiment produces an improvement in the amplitude imbalance in the frequency range approximately from 1.5 GHz to 6 GHz. As depicted in FIG. 31B, the impedance converting circuit according to the second modification to the tenth embodiment produces an improvement in the phase imbalance in the frequency range approximately from 3 GHz to 6 GHz.

It is confirmed from the simulation results depicted in the drawings from FIG. 30A to FIG. 31B that the characteristics of the impedance converting circuit are improved by connecting the capacitors Cp3 and Cp4 in parallel to the first secondary line 21 and the second secondary line 22, respectively.

Eleventh Embodiment

Next, referring to the drawings from FIG. 32 to FIG. 34B, description will be given with regard to an impedance converting circuit according to an eleventh embodiment. Description will be omitted herein with regard to the configuration that is the same as the configuration of the impedance converting circuit according to the second embodiment, which has been described with reference to the drawings from FIG. 4A to FIG. 7.

Figure 32:
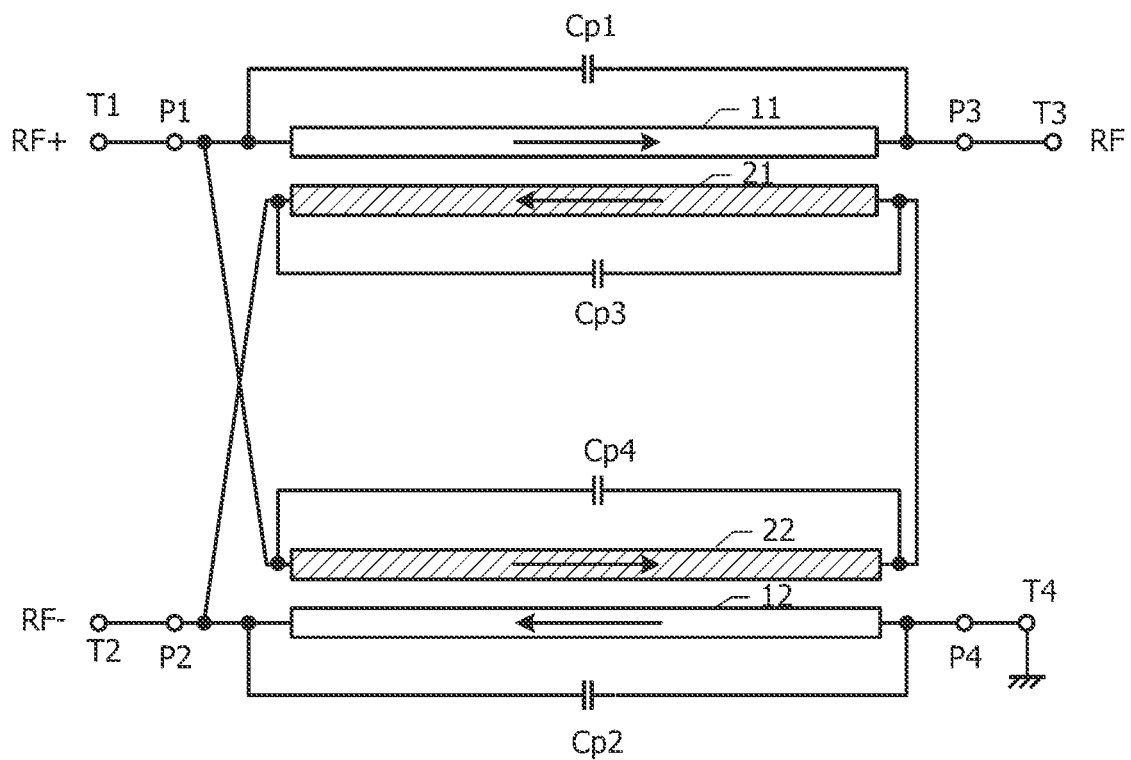
FIG. 32 is an equivalent circuit diagram of an impedance converting circuit according to an eleventh embodiment.

FIG. 32 is an equivalent circuit diagram of the impedance converting circuit according to the eleventh embodiment. In the second embodiment (FIG. 4A), the capacitors Cp1 and Cp2 are connected in parallel to the first primary line 11 and the second primary line 12, respectively. In contrast, in the eleventh embodiment, the capacitors Cp3 and Cp4 are further connected also in parallel to the first secondary line 21 and the second secondary line 22, respectively.

Next, description will be given with regard to a positive effect according to the eleventh embodiment.

In the eleventh embodiment, parallel resonance is caused by the second primary line 12 and the capacitor Cp2, and parallel resonance is caused by the second secondary line 22 and the capacitor Cp4. High impedance is obtained between the second node P2 and the fourth node P4 (ground) in a frequency range including this resonant frequency. Consequently, sufficient isolation between the second node P2 and the ground can be obtained. In addition, the capacitor Cp1 is connected in parallel to the first primary line 11, the capacitor Cp3 is connected in parallel to the first secondary line 21, the capacitor Cp2 is connected in parallel to the second primary line 12 and the capacitor Cp4 is connected in parallel to the second secondary line 22. Accordingly, the symmetry between a coupled transmission line formed by the first primary line 11 and the first secondary line 21 and a coupled transmission line formed by the second primary line 12 and the second secondary line 22 can be maintained.

Next, referring to the drawings from FIG. 33A to FIG. 34B, description will be given with regard to results of simulation performed to verify a positive effect according to the eleventh embodiment. The first primary line 11, the second primary line 12, the first secondary line 21, and the second secondary line 22 of an impedance converting circuit used for simulation are assumed to be 2000 μm long and 25 μm wide. The capacitances of the capacitors Cp1, Cp2, Cp3, and Cp4 are assumed to be 0.7 pF. Other simulation conditions are the same as the simulation conditions in FIG. 1C in the first embodiment.

Similarly to FIGS. 5A, 5B, 6A, and 6B in the second embodiment, FIGS. 33A, 33B, 34A, and 34B present graphs depicting insertion losses, common-mode rejection ratios, amplitude imbalances, and phase imbalances, respectively, of the impedance converting circuits. The solid lines and the dashed lines in these graphs represent simulation results for the impedance converting circuits according to the eleventh embodiment and a comparative example, respectively, and the comparative example includes none of the capacitors Cp1, Cp2, Cp3, and Cp4.

Figure 33A:
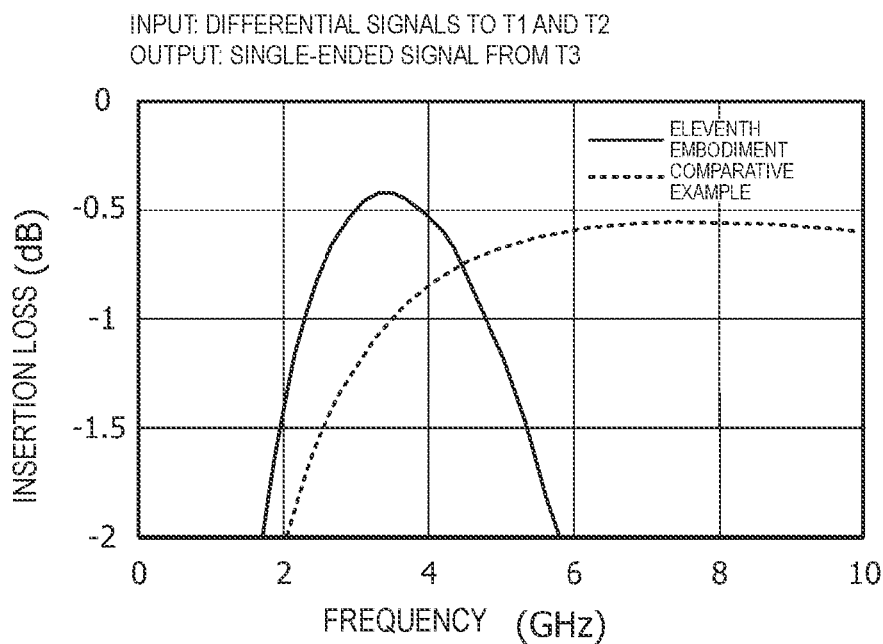
FIG. 33A is a graph depicting insertion losses of the impedance converting circuits according to the eleventh embodiment and a comparative example.
Figure 33B:
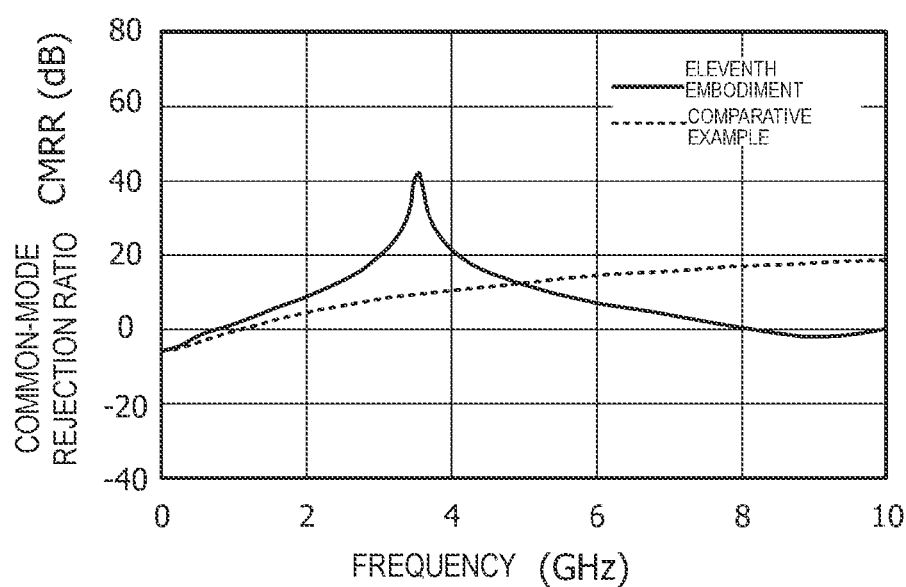
FIG. 33B is a graph depicting common-mode rejection ratios of the impedance converting circuits.
Figure 34A:
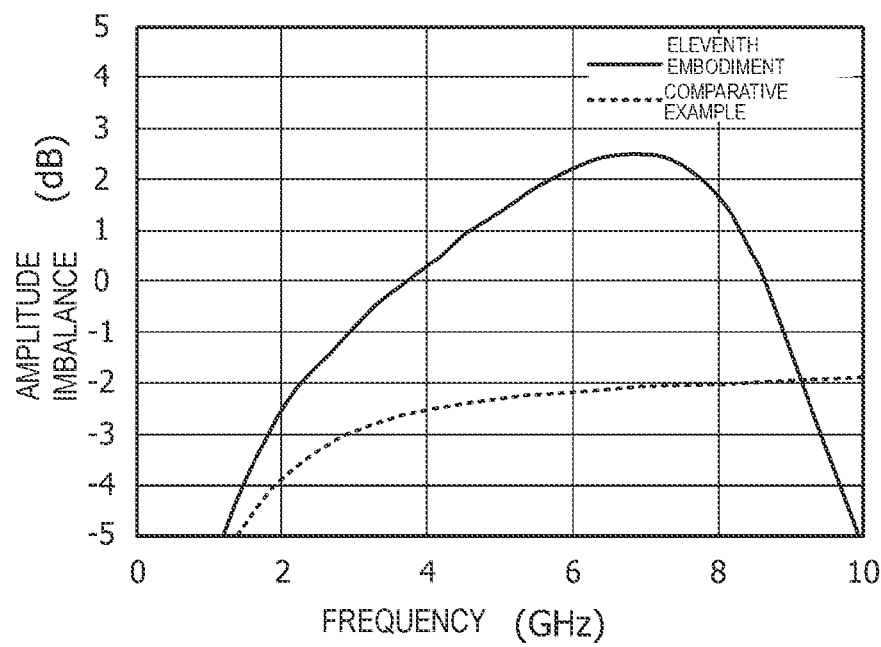
FIG. 34A is a graph depicting amplitude imbalances of the impedance converting circuits according to the eleventh embodiment and the comparative example.
Figure 34B:
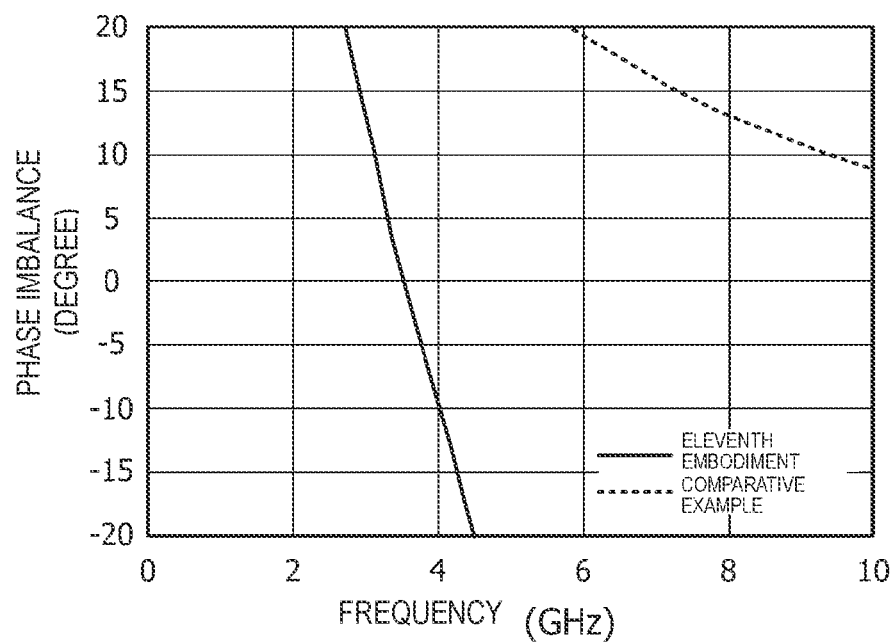
FIG. 34B is a graph depicting phase imbalances of the impedance converting circuits.

As depicted in FIG. 33A, the impedance converting circuit according to the eleventh embodiment produces an improvement in the insertion loss in the frequency range approximately from 2 GHz to 4.5 GHz compared with the impedance converting circuit according to the comparative example. As depicted in FIG. 33B, the impedance converting circuit according to the eleventh embodiment produces an improvement in the common-mode rejection ratio in the frequency range approximately from 1 GHz to 5 GHz. As depicted in FIG. 34A, the impedance converting circuit according to the eleventh embodiment produces an improvement in the amplitude imbalance in the frequency range approximately from 1.5 GHz to 6 GHz. As depicted in FIG. 34B, the impedance converting circuit according to the eleventh embodiment produces an improvement in the phase imbalance in the frequency range approximately from 3 GHz to 4.5 GHz.

It is confirmed from the simulation results depicted in the drawings from FIG. 33A to FIG. 34B that the characteristics of the impedance converting circuit are improved by connecting the capacitors Cp1 and Cp2 in parallel to the first primary line 11 and the second primary line 12, respectively, and further connecting the capacitors Cp3 and Cp4 in parallel to the first secondary line 21 and the second secondary line 22, respectively.

Twelfth Embodiment

Next, referring to FIG. 35 and FIG. 36, description will be given with regard to an impedance converting circuit according to a twelfth embodiment.

Figure 35:
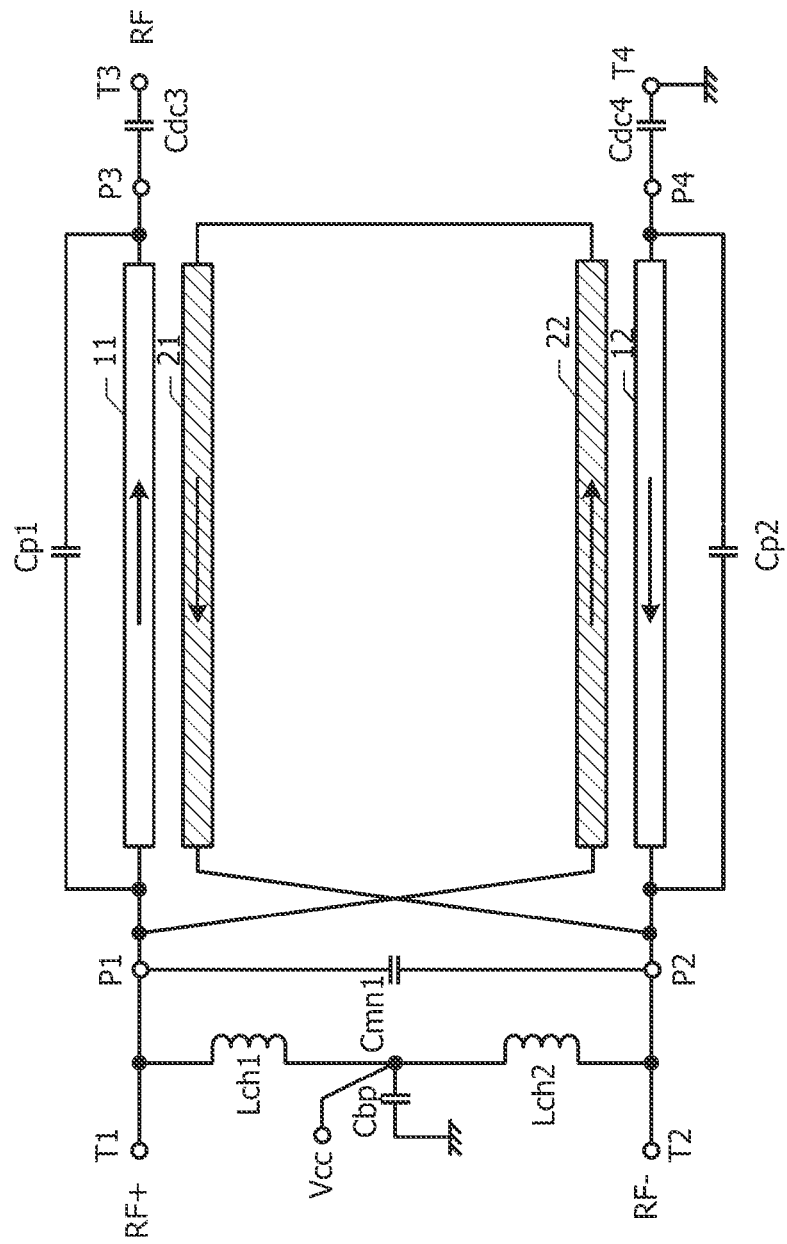
FIG. 35 is an equivalent circuit diagram of an impedance converting circuit according to a twelfth embodiment.

FIG. 35 is an equivalent circuit diagram of the impedance converting circuit according to the twelfth embodiment. In the impedance converting circuit according to the twelfth embodiment, the capacitors Cdc1 and Cdc2 in the impedance converting circuit according to the seventh embodiment (FIG. 22) are removed, and the capacitor Cmn1 is connected between the first node P1 and the second node P2 instead.

Figure 36:
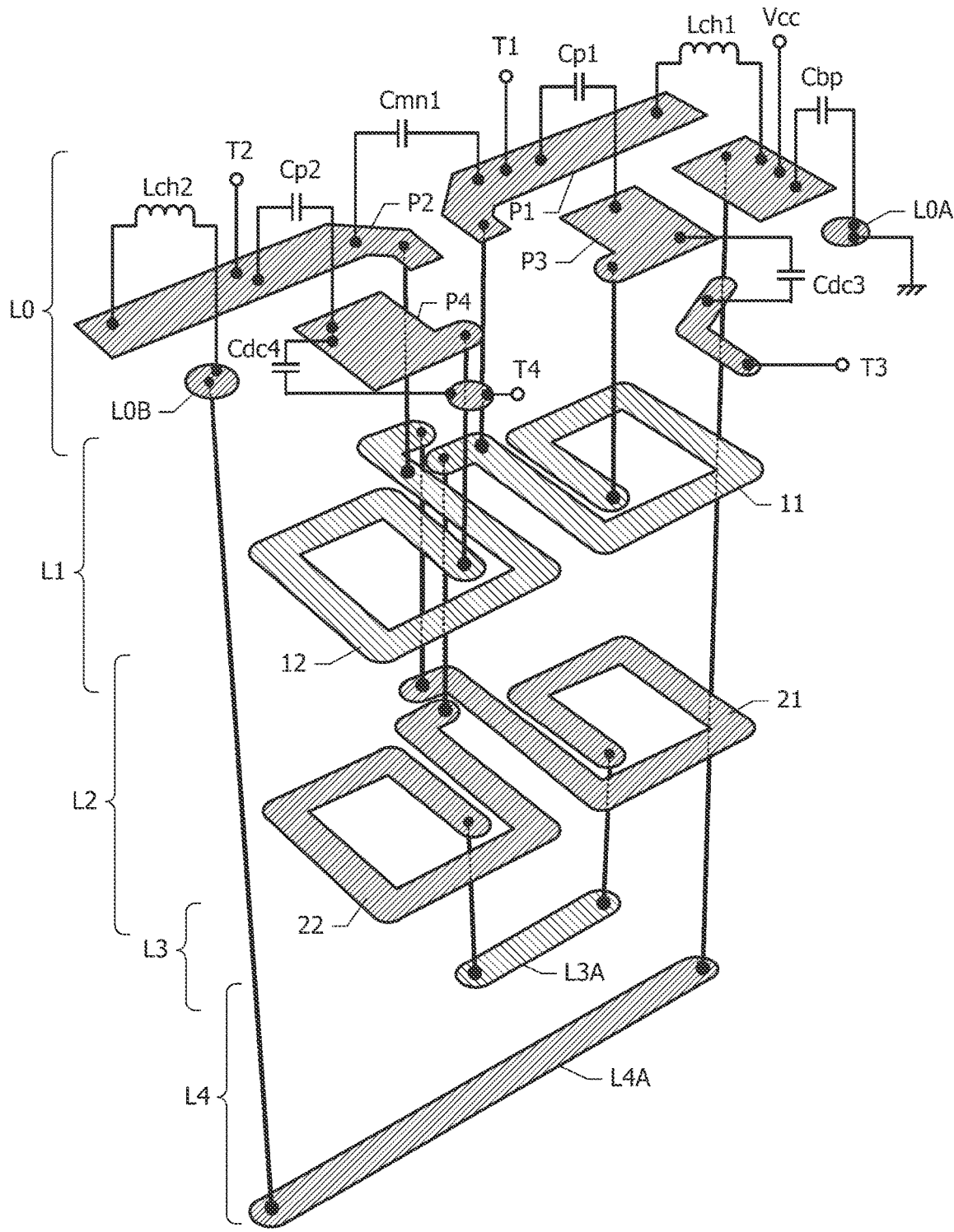
FIG. 36 is an exploded perspective view depicting conductor patterns of the impedance converting circuit according to the twelfth embodiment.

FIG. 36 is an exploded perspective view depicting conductor patterns of the impedance converting circuit according to the twelfth embodiment. The impedance converting circuit according to the twelfth embodiment is formed by a laminated substrate including dielectric layers and conductive layers that are alternately laminated. The laminated substrate includes a surface conductive layer L0 on the top surface and includes down from the top a first conductive layer L1, a second conductive layer L2, a third conductive layer L3, and a fourth conductive layer L4. Although not depicted in FIG. 36, a fifth conductive layer configured to function as a ground plane is disposed under the fourth conductive layer L4. This ground plane may be configured to function as a ground plane of a microstripline for the first primary line 11, the second primary line 12, the first secondary line 21, and the second secondary line 22. Further, the laminated substrate includes conductor patterns used as the first connection terminal T1, the second connection terminal T2, the third connection terminal T3, the fourth connection terminal T4 (ground terminal), and the power supply terminal Vcc on the bottom surface.

The surface conductive layer L0 includes conductor patterns configured to function as the first node P1, the second node P2, the third node P3, and the fourth node P4. The surface conductive layer L0 also includes respective conductor patterns connected to the third connection terminal T3, the fourth connection terminal T4, and the power supply terminal Vcc and further includes a conductor pattern L0A that is grounded and a conductor pattern L0B used as a junction.

The first conductive layer L1 down from the top includes respective conductor patterns forming the first primary line 11 and the second primary line 12. The first primary line 11 and the second primary line 12 each has a spiral shape with a turns ratio of approximately 5/4. Viewed from the top, the first primary line 11 winds clockwise from the inner end to the outer end, and the second primary line 12 winds counterclockwise from the inner end to the outer end.

The second conductive layer L2 down from the top includes respective conductor patterns forming the first secondary line 21 and the second secondary line 22. The first secondary line 21 has a shape such that the first primary line 11 substantially lies on top of the first secondary line 21 in plan view, and the second secondary line 22 has a shape such that the second primary line 12 substantially lies on top of the second secondary line 22 in plan view.

The third conductive layer L3 and the fourth conductive layer L4 down from the top include conductor patterns L3A and L4A, respectively. In addition to these conductor patterns, the conductive layers L1, L2, L3, and L4 include one or more inner-layer lands for joining via holes. Inner-layer lands are not depicted in FIG. 36.

An end portion on the outer side of the first primary line 11 is connected to the conductor pattern for the first node P1 with a via hole interposed therebetween, and an end portion on the inner side of the first primary line 11 is connected to the conductor pattern for the third node P3 with a via hole interposed therebetween. An end portion on the outer side of the second primary line 12 is connected to the conductor pattern for the second node P2 with a via hole interposed therebetween, and an end portion on the inner side of the second primary line 12 is connected to the conductor pattern for the fourth node P4 with a via hole interposed therebetween.

An end portion on the outer side of the first primary line 11 is connected to an end portion on the outer side of the second secondary line 22 with a via hole interposed therebetween. An end portion on the outer side of the second primary line 12 is connected to an end portion on the outer side of the first secondary line 21 with a via hole interposed therebetween. An end portion on the inner side of the first secondary line 21 is connected to an end portion on the inner side of the second secondary line 22 with a via hole, the conductor pattern L3A, and a via hole interposed therebetween. The conductor pattern connected to the power supply terminal Vcc is connected to the conductor pattern L0B used as a junction with a via hole, the conductor pattern L4A, and a via hole interposed therebetween.

The conductor patterns included in the surface conductive layer L0 are used as terminals for mounting surface mount components. The capacitor Cp1 is connected between the conductor pattern for the first node P1 and the conductor pattern for the third node P3. The capacitor Cp2 is connected between the conductor pattern for the second node P2 and the conductor pattern for the fourth node P4. The capacitor Cmn1 is connected between the conductor pattern for the first node P1 and the conductor pattern for the second node P2.

The choke coil Lch1 is connected between the conductor pattern for the first node P1 and the conductor pattern connected to the power supply terminal Vcc. The choke coil Lch2 is connected between the conductor pattern for the second node P2 and the conductor pattern L0B used as a junction.

The bypass capacitor Cbp is connected between the conductor pattern connected to the power supply terminal Vcc and the conductor pattern L0A. The conductor pattern L0A is grounded. The capacitor Cdc3 is connected between the conductor pattern connected to the third connection terminal T3 and the conductor pattern for the third node P3. The capacitor Cdc4 is connected between the conductor pattern connected to the fourth connection terminal T4 and the conductor pattern for the fourth node P4.

Next, description will be given with regard to a positive effect according to the twelfth embodiment.

Since a single laminated substrate includes the first primary line 11, the second primary line 12, the first secondary line 21, and the second secondary line 22, the impedance converting circuit can be downsized. Since the first primary line 11, the second primary line 12, the first secondary line 21, and the second secondary line 22 are each formed by a conductor pattern having a spiral shape, large self-inductance can be obtained for these transmission lines. Since the first primary line 11 lies on top of the first secondary line 21 in plan view, a strong electromagnetic coupling between the first primary line 11 and the first secondary line 21 can be obtained. A similar effect can also be obtained for the second primary line 12 and the second secondary line 22.

Next, description will be given with regard to an impedance converting circuit according to a modification to the twelfth embodiment.

Although surface mount components are used as the capacitors Cp1, Cp2, Cdc3, and Cdc4, the bypass capacitor Cbp, and the choke coils Lch1 and Lch2 in the twelfth embodiment, some of these passive components may be formed by conductor patterns in the laminated substrate.

Although the first primary line 11, the second primary line 12, the first secondary line 21, and the second secondary line 22 each has a spiral shape in the twelfth embodiment, these transmission lines form distributed parameter circuits and may have other shapes. For example, these transmission lines may each have a linear shape.

Thirteenth Embodiment

Next, referring to FIG. 37, description will be given with regard to a radio-frequency power amplifier according to a thirteenth embodiment.

Figure 37:
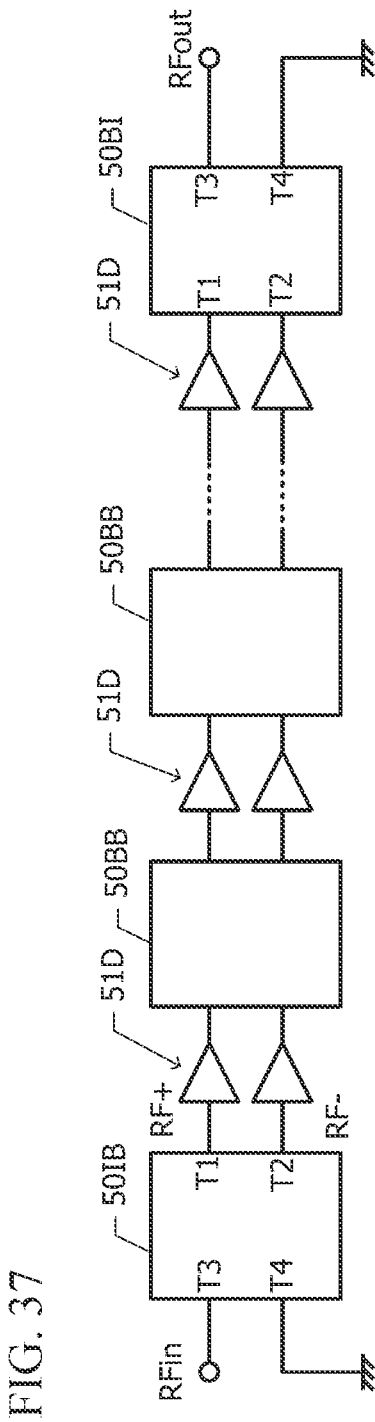
FIG. 37 is a block diagram of a radio-frequency power amplifier according to a thirteenth embodiment.

FIG. 37 is a block diagram of the radio-frequency power amplifier according to the thirteenth embodiment. The radio-frequency power amplifier according to the thirteenth embodiment includes multiple differential amplifiers 51D connected in cascade. An unbalanced-balanced converting circuit 501B configured to convert a single-ended signal into differential signals is connected to the input side of a differential amplifier 51D at the first stage. The unbalanced-balanced converting circuit 501B has a function of converting a single-ended signal RFin into differential signals RF+ and RF− and performing impedance matching.

For example, the impedance converting circuit according to the second embodiment (FIG. 4A) is used as the unbalanced-balanced converting circuit 501B. The single-ended signal RFin is input into the third connection terminal T3, and the differential signals RF+ and RF− are output from the first connection terminal T1 and the second connection terminal T2. The fourth connection terminal T4 is grounded. The impedance converting circuits according to the other embodiments having an unbalanced-balanced converting function may be used as the unbalanced-balanced converting circuit 50IB.

An impedance converting circuit 50BB as an impedance matching circuit between stages is connected between differential amplifiers 51D at multiple stages. For example, the impedance converting circuit according to the ninth embodiment (FIG. 26) is used as the impedance converting circuit 50BB for differential signals. A terminal pair is formed by the first connection terminal T1 and the second connection terminal T2, and another terminal pair is formed by the third connection terminal T3 and the fourth connection terminal T4. Differential signals are input into one of the two terminal pairs, and differential signals are output from the other terminal pair.

A balanced-unbalanced converting circuit 50BI configured to convert differential signals into a single-ended signal is connected to the output side of the differential amplifier 51D at the final stage. The balanced-unbalanced converting circuit 50BI has a function of converting the differential signals RF+ and RF− into a single-ended signal RFout and performing impedance matching.

For example, the impedance converting circuit according to the second embodiment (FIG. 4A) is used as the balanced-unbalanced converting circuit 50BI. The differential signals RF+ and RF− are input into the first connection terminal T1 and the second connection terminal T2, and the single-ended signal RFout is output from the third connection terminal T3. The fourth connection terminal T4 is grounded. The impedance converting circuits according to the other embodiments having a balanced-unbalanced converting function may be used as the balanced-unbalanced converting circuit 50BI.

Next, description will be given with regard to a positive effect according to the thirteenth embodiment.

In the thirteenth embodiment, an impedance converting circuit such as described in the second embodiment (FIG. 4A) is used as the unbalanced-balanced converting circuit 50IB at the first stage and the balanced-unbalanced converting circuit 50BI at the final stage, and the impedance converting circuit according to the ninth embodiment (FIG. 26) is used as the impedance converting circuit 50BB between stages. Accordingly, sufficient isolation can be obtained between the connection terminals on the input side and the connection terminals on the output side.

Next, description will be given with regard to a modification to the thirteenth embodiment.

In the thirteenth embodiment, the impedance converting circuits according to the above embodiments are used as the unbalanced-balanced converting circuit 50IB at the first stage, the impedance converting circuits 50BB between stages, and the balanced-unbalanced converting circuit 50BI at the final stage, but the impedance converting circuits according to the above embodiments may be used as some of the unbalanced-balanced converting circuit 50IB at the first stage, the impedance converting circuits 50BB between stages, and the balanced-unbalanced converting circuit 50BI at the final stage.

Figure 38:
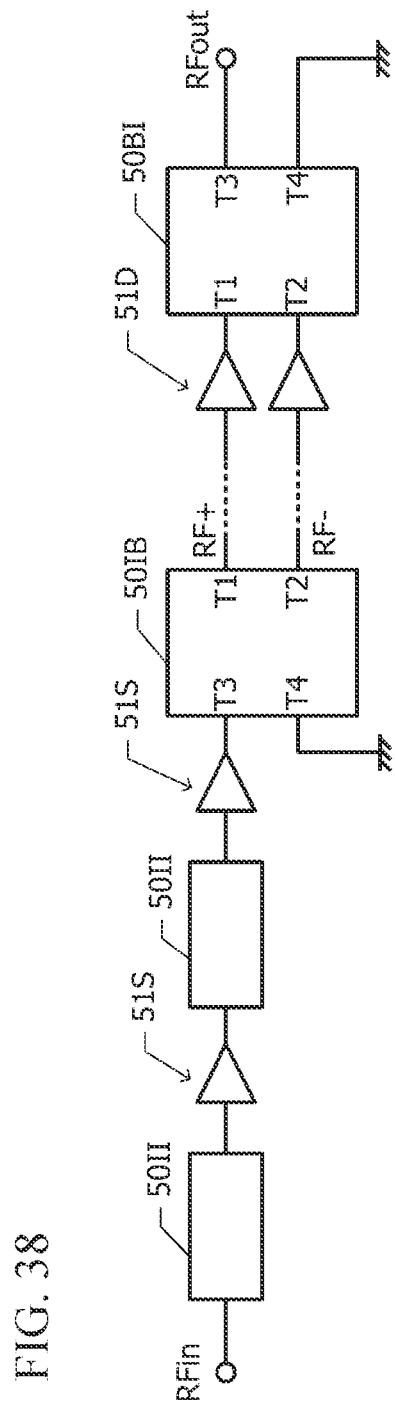
FIG. 38 is a block diagram of a radio-frequency power amplifier according to a modification to the thirteenth embodiment.
Figure 39:
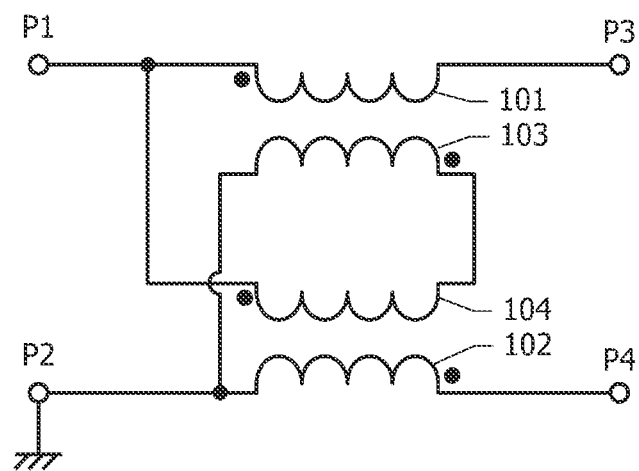
FIG. 39 is an equivalent circuit diagram of a Guanella-type balanced-unbalanced converting circuit disclosed by Hua-Yen et al. in "Design of Step-Down Broadband and Low-Loss Ruthroff-Type Baluns Using IPD Technology", IEEE TRANSACTIONS ON COMPONENTS, PACKAGING AND MANUFACTURING TECHNOLOGY, VOL. 4, NO. 6, JUNE 2014.

Next, referring to FIG. 38, description will be given with regard to a radio-frequency power amplifier according to another modification to the thirteenth embodiment. FIG. 38 is a block diagram of the radio-frequency power amplifier according to the other modification to the thirteenth embodiment. In the present modification, of the amplifiers at multiple stages, single-ended signal amplifiers 51S are used as amplifiers at multiple stages on the input side, and the differential amplifiers 51D are used as the amplifiers at the remaining multiple stages. An impedance converting circuit 5011 for impedance matching is connected to the input side of the single-ended signal amplifier 51S at the first stage and between the single-ended signal amplifiers 51S.

The unbalanced-balanced converting circuit 50IB is connected between the single-ended signal amplifier 51S at the most downstream stage and the differential amplifier 51D at the most upstream stage. The unbalanced-balanced converting circuit 50IB and the configuration at the subsequent stages are the same as the configuration of the radio-frequency power amplifier according to the thirteenth embodiment (FIG. 37).

As in the present modification, single-ended signal amplifiers 51S and differential amplifiers 51D may be combined to form a radio-frequency power amplifier having multiple stages.

The above embodiments are described for illustration, and partial substitutions or combinations of the configurations described in different embodiments are obviously feasible. Similar operations and similar effects achievable by similar configurations described in multiple embodiments are not individually described in each of the embodiments. Further, the present disclosure is not limited to the above embodiments. For example, it should be apparent to those skilled in the art that various kinds of modification, improvement, combination, and the like are feasible.

What is claimed is:

1. An impedance converting circuit comprising:
a first primary line that has a first node at one end and a third node at an opposite end, and that is configured to transmit a first radio-frequency signal between the first node and the third node;
a second primary line that has a second node at one end and a fourth node at an opposite end, and that is configured to transmit a second radio-frequency signal between the second node and the fourth node;
a first secondary line that is connected to the second node and that is electromagnetically coupled to the first primary line;
a second secondary line that has an end portion connected to the first node, that has an opposite end portion connected to an end portion of the first secondary line not connected to the second node, and that is electromagnetically coupled to the second primary line; and
a first capacitor connected in parallel to a part of the second primary line or a part of the second secondary line.

2. The impedance converting circuit according to claim 1, wherein the first capacitor is connected to both ends of the second primary line.

3. The impedance converting circuit according to claim 2, wherein the first capacitor is connected in parallel to the second primary line.

4. The impedance converting circuit according to claim 1, further comprising:
a second capacitor connected in parallel to a part of the first primary line or a part of the first secondary line.

5. The impedance converting circuit according to claim 1, further comprising:
a parallel reactance element,
wherein one terminal of the parallel reactance element is connected to the first node and an opposite terminal of the parallel reactance element is connected to the second node, or
wherein the one terminal of the parallel reactance element is connected to the third node and the opposite terminal of the parallel reactance element is connected to the fourth node.

6. The impedance converting circuit according to claim 3, further comprising:
a parallel reactance element,
wherein one terminal of the parallel reactance element is connected to the first node and an opposite terminal of the parallel reactance element is connected to the second node, or
wherein the one terminal of the parallel reactance element is connected to the third node and the opposite terminal of the parallel reactance element is connected to the fourth node.

7. The impedance converting circuit according to claim 4, further comprising:
a parallel reactance element,
wherein one terminal of the parallel reactance element is connected to the first node and an opposite terminal of the parallel reactance element is connected to the second node, or wherein the one terminal of the parallel reactance element is connected to the third node and the opposite terminal of the parallel reactance element is connected to the fourth node.

8. The impedance converting circuit according to claim 1, further comprising:
a first connection terminal, a second connection terminal, a third connection terminal, and a fourth connection terminal that are connected to the first node, the second node, the third node, and the fourth node, respectively.

9. The impedance converting circuit according to claim 8, wherein the second connection terminal or the fourth connection terminal is a ground terminal connected to a ground potential.

10. The impedance converting circuit according to claim 9,
wherein the first node and the second node are a first node pair, the third node and the fourth node are a second node pair, and
wherein the impedance converting circuit is a balanced-unbalanced converting circuit configured to receive a signal at the first or second node pair and to output the signal from the other of the first or second node pair.

11. The impedance converting circuit according to claim 8, further comprising:
a series reactance element,
wherein the series reactance element is connected in series between the first node and the first connection terminal, or
wherein the series reactance element is connected in series between the second node and the second connection terminal, or
wherein the series reactance element is connected in series between the third node and the third connection terminal, or
wherein the series reactance element is connected in series between the fourth node and the fourth connection terminal.

12. The impedance converting circuit according to claim 9, further comprising:
a series reactance element,
wherein the series reactance element is connected in series between the first node and the first connection terminal, or
wherein the series reactance element is connected in series between the second node and the second connection terminal, or
wherein the series reactance element is connected in series between the third node and the third connection terminal, or
wherein the series reactance element is connected in series between the fourth node and the fourth connection terminal.

13. The impedance converting circuit according to claim 10, further comprising:
a series reactance element,
wherein the series reactance element is connected in series between the first node and the first connection terminal, or
wherein the series reactance element is connected in series between the second node and the second connection terminal, or
wherein the series reactance element is connected in series between the third node and the third connection terminal, or
wherein the series reactance element is connected in series between the fourth node and the fourth connection terminal.

14. The impedance converting circuit according to claim 1, further comprising:
a power supply terminal; and
a choke coil connected between the power supply terminal and a node at which the first secondary line and the second secondary line are connected.

15. The impedance converting circuit according to claim 6, further comprising:
a power supply terminal;
a first choke coil connected between the power supply terminal and the first connection terminal; and
a second choke coil connected between the power supply terminal and the second connection terminal.

16. The impedance converting circuit according to claim 1, further comprising:
a laminated substrate having one or more dielectric layers and one or more conductive layers that are alternately laminated,
wherein the one or more conductive layers in the laminated substrate include the first primary line and the second primary line.

17. The impedance converting circuit according to claim 12, wherein the laminated substrate includes a ceramic multilayer substrate, a multilayer resin substrate, or a semiconductor substrate having multiple wiring layers.

18. An amplifier module comprising:
the impedance converting circuit according to claim 9; and
a differential amplifier having a pair of differential output nodes and a pair of differential input nodes, the pair of differential output nodes or the pair of differential input nodes are connected to the first node and the second node.

19. An amplifier module comprising:
the impedance converting circuit according to claim 1; and
a differential amplifier having a pair of differential output nodes and a pair of differential input nodes, the pair of differential output nodes or the pair of differential input nodes being connected to the first node and the second node,
wherein the first capacitor and the part of the second primary line connected in parallel to the first capacitor or the part of the second secondary line connected in parallel to the first capacitor, are configured to cause a parallel resonance at a frequency in an operating frequency band of the differential amplifier.

* * * * *